United States Patent [19]
Okase et al.

[11] Patent Number: 5,651,670
[45] Date of Patent: Jul. 29, 1997

[54] HEAT TREATMENT METHOD AND APPARATUS THEREOF

[75] Inventors: Wataru Okase, Sagamihara; Yasushi Yagi, Zama; Satoshi Kawachi, Yokohama, all of Japan

[73] Assignee: Tokyo Electron Sagami Kabushiki Kaisha, Japan

[21] Appl. No.: 341,047

[22] Filed: Nov. 16, 1994

Related U.S. Application Data

[63] Continuation of Ser. No. 987,024, Dec. 7, 1992, Pat. No. 5,429,498.

[30] Foreign Application Priority Data

| Dec. 13, 1991 | [JP] | Japan | 3-351331 |
| Dec. 18, 1991 | [JP] | Japan | 3-353010 |
| Jan. 27, 1992 | [JP] | Japan | 4-33992 |
| Apr. 21, 1992 | [JP] | Japan | 4-126688 |
| Apr. 23, 1992 | [JP] | Japan | 4-130192 |
| Apr. 23, 1992 | [JP] | Japan | 4-130193 |
| Aug. 26, 1992 | [JP] | Japan | 4-252138 |

[51] Int. Cl.⁶ ............................................. F27D 5/00
[52] U.S. Cl. ......................... 432/5; 432/6; 432/11; 432/241
[58] Field of Search .................. 432/11, 5, 241, 432/6, 152, 253

[56] References Cited

U.S. PATENT DOCUMENTS

| 5,131,842 | 7/1992 | Miyazaki et al. | 342/5 |
| 5,221,201 | 6/1993 | Yamaga et al. | 432/241 |
| 5,249,960 | 10/1993 | Monoe | 432/5 |
| 5,271,732 | 12/1993 | Yokokawa | 432/241 |
| 5,273,424 | 12/1993 | Kabayahi | 432/11 |
| 5,330,352 | 7/1994 | Watanabe et al. | 432/241 |
| 5,429,498 | 7/1995 | Okase et al. | 432/241 |

*Primary Examiner*—Marguerite McMahon
*Attorney, Agent, or Firm*—Beveridge, DeGrandi, Weilacher & Young LLP

[57] ABSTRACT

The present invention relates to a thermal processing method wherein a cylindrical process tube that has at one end an entrance/exit is provided at the other end thereof with a heat source, and thermal processing is performed on a workpiece which has been brought in from the entrance/exit of the process tube to a prescribed position therein. This thermal processing method and an apparatus therefor is characterized in that, when the workpiece is moved to the prescribed position, it is first moved to a proximity position that is closer to the heat source than the prescribed position, then it is returned therefrom to the prescribed position. The invention is further characterized in that, if the actual processing temperature at the prescribed position changes while the workpiece is undergoing thermal processing, the workpiece is moved such that the position of the workpiece with respect to the heat generation source is changed in order to return the processing temperature at the prescribed position to the prescribed processing temperature. This ensures that the temperature of the workpiece can be rapidly raised to the prescribed processing temperature and also that, if the temperature of the workpiece should change, it can be rapidly returned to the prescribed processing temperature.

8 Claims, 21 Drawing Sheets

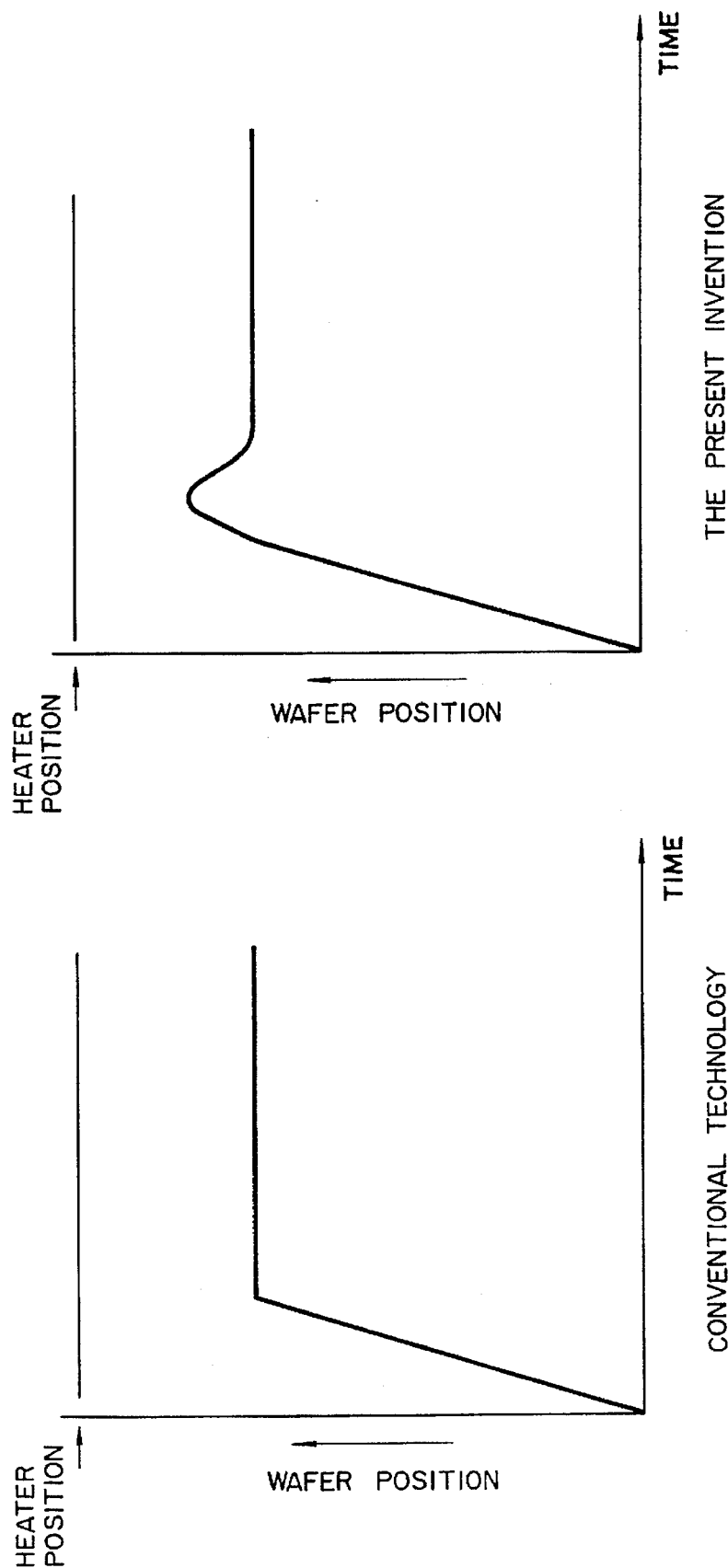

THE PRESENT INVENTION

CONVENTIONAL TECHNOLOGY

WAFER POSITION VS. WAFER TEMPERATURE

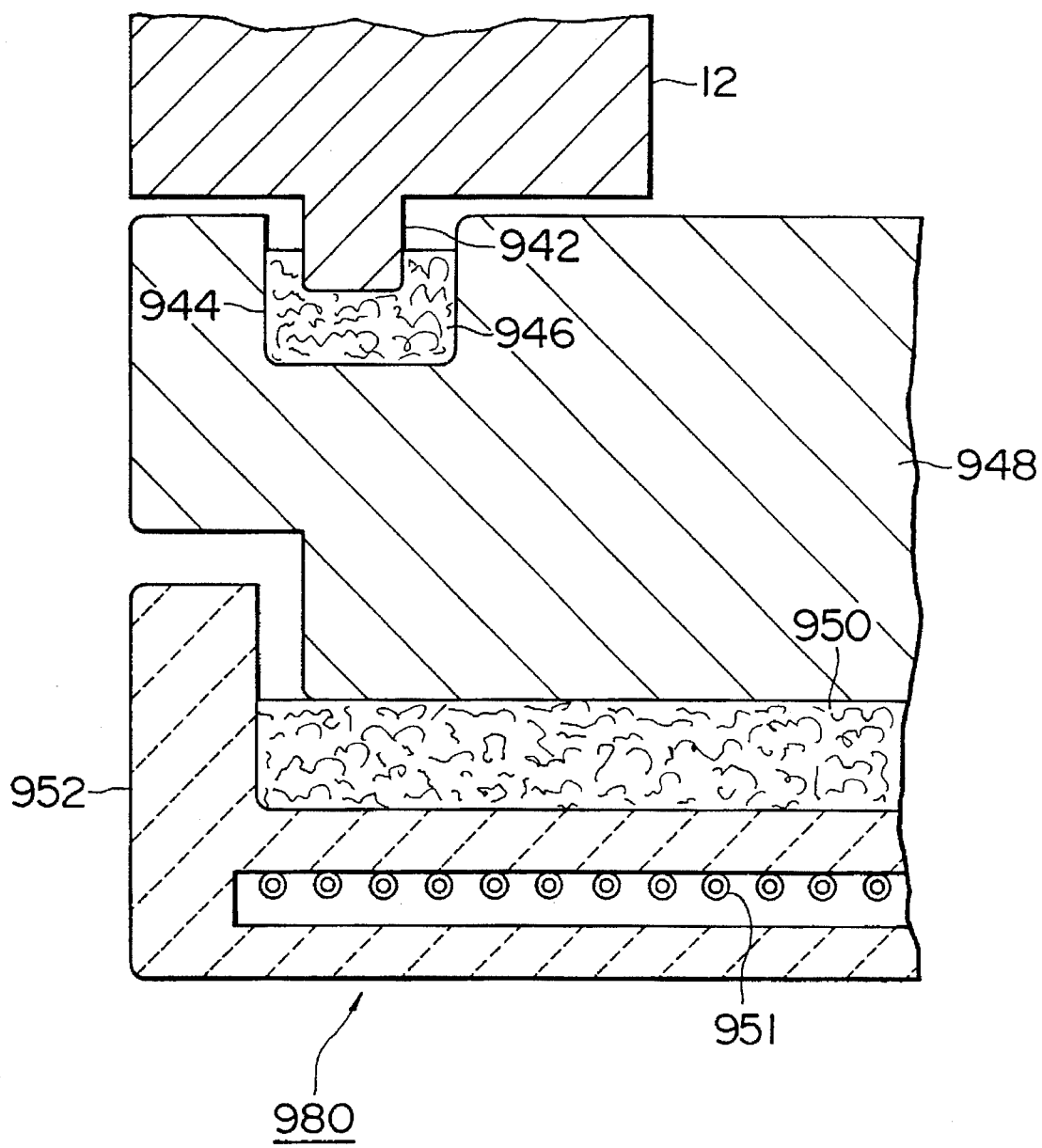
F I G. 16

HEAT TREATMENT METHOD AND APPARATUS THEREOF

This application is a continuation of application Ser. No. 07/987,024 filed on Dec. 7, 1992, U.S. Pat. No. 5,429,418, which is incorporated entirely herein by reference.

BACKGROUND OF THE INVENTION

The present invention relates to a thermal processing method and an apparatus therefor.

During the fabrication of a semiconductor wafer, the wafer undergoes various processes such as oxide diffusion and chemical vapor deposition (CVD). A particular problem is caused by the way in which design rules of semiconductor devices are continuing to become finer (from 0.4 µm to 0.2 µm) whilst the semiconductor wafers are becoming even larger in size (from eight inches to 12 inches). For these reasons, there is intense interest in developing a rapid thermal processing (heat treatment) apparatus that can be used with the ultra-thin film creation technology used for wafers of such large areas.

An essential condition during the processing of a semiconductor wafer is to reduce the thermal budget. During 50 to 100 Å doping or the creation of an ultra-fine gate oxide film or capacitor isolation film, rapid heating (in other words, heating within a short period of time) is essential during 50 to 100 Å doping or the creation of an ultra-fine gate oxide film or capacitor isolation film, for example.

In order to design lower resistances on thinner PN junctions of less than 0.1 µm and enable junction fabrication on any desired shape of surface, for instance, it is necessary to prevent the films from deteriorating and crystal defects from generating when the junction is made. However, the active region of the PN junction is so narrow, rapid thermal processing is necessary.

In addition, during the creation of a film such as a LOCOS oxide film, compression stresses in the neighboring LOCOS oxide film are increased by a multiplication effect due to thermal cycling, so that the reliability of characteristics such as changes in surface potential, leakage current, and withstand voltage is liable to drop. In order to prevent this, it is necessary to reduce thermal cycling by using rapid thermal processing.

When forming capacitor isolation films using a highly dielectric material, it has become essential to use systems that provide compound processing which includes doping and metal film creation processes that enable the formation of films of substances such as metal oxides (such as $Ta_2O_3$) and polyamides (passivation films).

Since the diameters of semiconductor wafers are currently increasing from eight inches to 12 inches, it is necessary to facilitate a uniform, rapid thermal processing that minimizes temperature differences between the center and periphery of a semiconductor wafer, create designs that reduce the slippage, distortion, and warping that are liable to occur in semiconductor operations, and also ensure that defects do not occur during the fabrication of semiconductor devices.

However, in a conventional longitudinal batch type of thermal processing apparatus, a cylindrical heat source is positioned around a stack of semiconductor wafers held in a wafer boat made of high purity quartz, and heat from this source is directed from the peripheral parts of the wafers toward the centers thereof. This causes a problem in that uniform thermal processing is impossible because any attempt made to heat the semiconductor wafers rapidly will generate a large thermal gradient between the center and periphery of each semiconductor wafer.

These circumstances led the inventors of the present invention to continue their research into technology designed to ensure a uniform temperature within a semiconductor wafer, by positioning a heat source at the other end of a cylindrical process tube which has at its one end an entrance/exit, and thermally processing a workpiece at a prescribed position to which it is brought from the entrance/exit of the process tube. They have ascertained that, even with this thermal processing method, simply bringing the semiconductor wafer as it is from the entrance/exit of the process tube is not sufficient to bring the temperature of the semiconductor wafer to the prescribed processing temperature, and time is required until the temperature stabilizes at the prescribed processing temperature. They have also identified another problem in that, if the actual temperature of the workpiece placed at the prescribed position should deviate from the prescribed processing temperature while the workpiece is being processed, temperature control by the heat source makes it difficult to quickly return the temperature to the prescribed processing temperature.

SUMMARY OF THE INVENTION

A first object of the present invention is to provide a thermal processing method that enables a rapid increase of temperature of a workpiece up to a prescribed processing temperature, in a thermal processing method wherein a cylindrical process tube that has at one end an entrance/exit is provided at the other end thereof with a heat source, and a thermal processing is performed on a workpiece which has been brought in from the entrance/exit of the process tube.

A second object of the present invention is to provide a thermal processing method that can rapidly return the temperature of a workpiece to a prescribed processing temperature if it should deviate therefrom, in a thermal processing method wherein a cylindrical process tube that has at one end an entrance/exit is provided at the other end thereof with a heat source, and a thermal processing is performed on a workpiece which has been brought in from the entrance/exit of the process tube.

To achieve the above objects, the thermal processing method of the present invention is characterized in that, in a thermal processing method wherein a cylindrical process tube that has at one end an entrance/exit is provided at the other end thereof with a heat source, and a thermal processing is performed on a workpiece which has been brought in from the entrance/exit of the process tube, when the workpiece is moved to the prescribed position, it is first moved to a proximity position that is closer to the heat source than the prescribed position, then it is returned therefrom to the prescribed position.

The method of the present invention is also characterized in that, in a thermal processing method wherein a cylindrical process tube that has at one end an entrance/exit is provided at the other end thereof with a heat source, and a thermal processing is performed on a workpiece which has been brought in from the entrance/exit of the process tube, if the processing temperature at the prescribed position should deviate in operation, the position of the workpiece with respect to the heat source is changed in order to bring the temperature to the prescribed processing temperature.

The construction in which a heat source is positioned at the other end of a cylindrical process tube which has at its one end an entrance/exit ensures that a temperature gradient is formed within the process tube in proportion to distance from the heat source.

Therefore, if the workpiece is brought in from the entrance/exit of a reaction tube, its temperature can be gradually increased in accordance with the distance it is moved, or, in other words, in accordance with its proximity to the heat source.

With the present invention, when the workpiece is moved to the prescribed position, it is first moved to a proximity position that is closer to the heat source than the prescribed position, so that the temperature of the workpiece can rapidly reach a temperature close to the prescribed processing temperature. When the workpiece is subsequently returned to the prescribed position, it can immediately stabilize at the prescribed processing temperature corresponding to the prescribed position.

In this way, the present invention is designed to ensure that, when the workpiece reaches the prescribed position, the temperature of the workpiece is brought rapidly to the prescribed processing temperature by bringing the workpiece into too-close proximity to the heat source to ensure it receives an excess of thermal energy.

In addition, if the temperature of the workpiece should deviate while the workpiece is being thermally processed, since the position of the workpiece with respect to the heat source can be changed, temperature control in accordance with distance from the heat source is enabled, and the heat source itself can be used to provide temperature control to rapidly return the temperature to the prescribed processing temperature.

BRIEF DESCRIPTION OF THE DRAWINGS

FIG. 8A is a graph showing conventional wafer transportation methods.

FIG. 8B is a graph showing wafer transportation methods according to an embodiment of the present invention.

FIG. 16 is a partial expanded lateral cross-sectional view of the cross-sectional structure of a second lid drive section of the thermal processing apparatus of FIG. 12.

DETAILED DESCRIPTION OF THE PREFERRED EMBODIMENTS

EMBODIMENT 1

A specific embodiment of a multi-wafer type of thermal processing apparatus using the thermal processing method of the present invention is described below, with reference to the accompanying figures.

Figure 1:
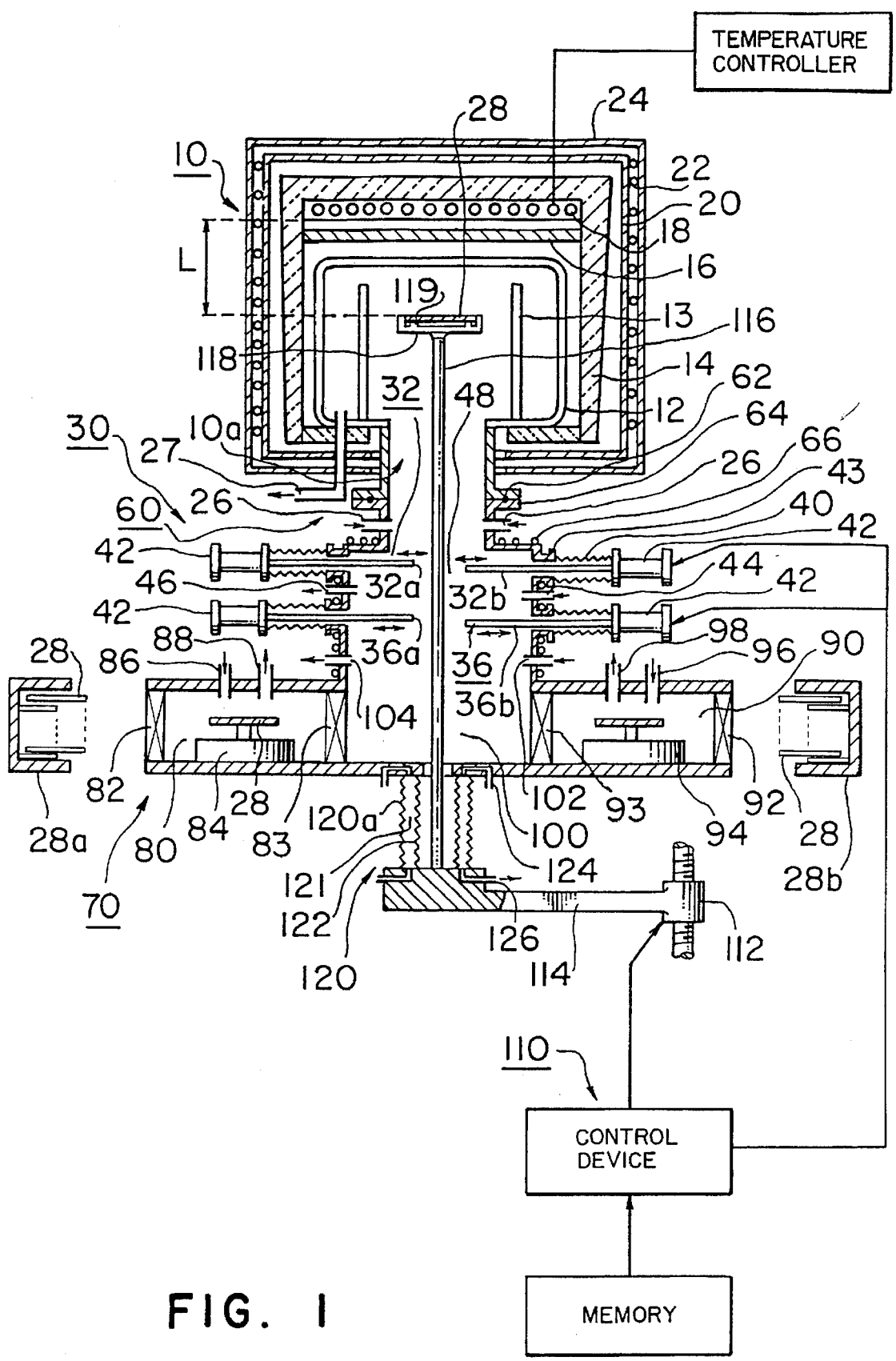
FIG. 1 is an abbreviated lateral cross-sectional view illustrating one embodiment of the thermal processing apparatus of the present invention.

The thermal processing apparatus of this embodiment comprises, as shown mainly in FIG. 1, of a workpiece such as a semiconductor wafer 28, a thermal processing section 10 used for performing one of a variety of thermal processes such as those for the formation of LCDs on individual wafers in sequence, a shutter drive section 30 for thermally isolating the interior of the thermal processing section 10 from other portions of the thermal processing apparatus while the thermal processing is in process, a wafer conveyor section 70 for conveying a wafer 28 into and out of the interior of the thermal processing apparatus while maintaining a sealed condition with respect to the outer atmosphere, and a wafer elevator section 110 for rapidly heating the wafer 28 by bringing the wafer 28 and a flat heat generation source 18 into close proximity with each other.

The structure of the thermal processing section 10 is described below.

A process tube 12 is designed to perform thermal processing on a workpiece, such as a semiconductor wafer 28 which will become an LCD, and is made of a substance such as quartz that has superior thermal insulation characteristics and minimal contamination ability. This process tube 12 has a double-walled tubular structure containing an inner tube 13. This configuration ensures that the process gas introduced into the process tube 12 can be made to have the optimal flow, and that a film formed on the wafer 28 can be designed to have a uniform thickness and improved quality.

A thermal insulation material 14 of a substance such as alumina ceramic is provided to cover this process tube 12. This thermal insulation material 14 has a configuration such that it becomes gradually thinner nearer its lower end, as shown in FIG. 1, to foster a suitable humidity gradient along the direction in which the wafer 28 travels. This ensures that the thermal insulation effect decreases toward the lower part of the thermal insulation material 14.

The flat heat generation source 18 is fixed to the inner wall at the top of the thermal insulation material 14, in the upper part of the process tube 12. This flat heat generation source 18 can be of a configuration such that a resistance heating element of a wire such as molybdenum disilicide ($MoSi_2$) or kanthal (tradename of an alloy of iron (Fe), chrome (Cr), and aluminum (Al)), is arranged in a flat shape. If molybdenum disilicate is used, it can be used as a single wire; kanthal can be used as a coil. Since molybdenum disilicide can cope with high temperatures in the region of 1800° C., it is particularly suitable as an oxide diffusion material. The flat heat generation source 18 is configured of a single-wire resistance heating element of a material such as molybdenum disilicide, arranged in a spiral. The flat heat generation source 18 is also controlled to remain at a fixed temperature by a temperature controller in contact therewith.

The heat generation surface of the flat heat generation source 18 is preferably of the same circular shape as that of the surface of the wafer 28 which is being thermally processed, and the outer diameter of the heat generation surface of the flat heat generation source 18 is preferably at least twice that of the wafer 28. In addition, the heat generation surface of the flat heat generation source 18 is preferably arranged parallel to the surface of the wafer 28, but the shape of the heat generation surface can either be completely flat or bent such that the peripheral portion thereof comes closer to the wafer 28.

The distance L shown in FIG. 1 is the minimum separation distance between the wafer 28 and the flat heat generation source 18. The setting of the maximum value of the temperature to which the wafer 28 is heated is determined by this distance L, as described below. In order to reduce the size of the thermal processing apparatus, it is best to make the minimum separation distance L short; but in order to heat the entire surface of the wafer 28 to a uniform temperature, bearing in mind the radiation pattern of the heat, it is best to make it longer. A specific distance that satisfies both conditions is of the order of 300 to 600 mm.

A thermal equalizer portion 16 is provided between the flat heat generation source 18 and the wafer 28. This thermal equalizer portion 16 controls the radiant heat directed toward the wafer 28 in such as manner that it is directed sufficiently perpendicularly toward the wafer 28, to cancel out any unevenness in the heating of the flat heat generation source 18. The thermal equalizer portion 16 is preferably constructed of a non-contaminating material such as high-purity silicon carbide (SIC). This ensures that the flat heat generation source 18 is completely isolated by a processing space, and thus ensures that contamination by heavy metals is prevented, even if the flat heat generation source 18 is constructed of a material containing a heavy metal that would otherwise be a cause of contamination of the workpiece that is being thermally processed.

The thermal equalizer portion 16 is provided in such a manner as to face the surface of the wafer 28 that is being thermally processed, and the outer diameter thereof is preferably at least twice that of the wafer 28, in the same way as with the flat heat generation source 18. The shape of the thermal equalizer portion 16 could be such that the thickness at the center thereof is greater than that around the periphery thereof, or such that the periphery thereof is bent in the direction to come closer to the wafer 28 in the same manner as the flat heat generation source 18. Adjusting the shape in such a manner ensures that heat diffusion around the periphery of the wafer 28 is reduced, thus enabling a further increase in the uniformity of temperature between the center and the periphery of the wafer 28.

The periphery of the thermal insulation material 14 is of a double-walled construction wherein, for example, an inner shell 20 and an outer shell 24 made of a material such as stainless steel are provided. A water cooling mechanism 22 is provided between the inner shell 20 and the outer shell 24, to thermally isolate the interior of the thermal processing section 10 from the exterior thereof. This ensures that the safety of operations outside the thermal processing section 10 can be sufficiently guaranteed, even while high-temperature thermal processing is proceeding within the thermal processing section 10.

A manifold 60 constructed of a material such as quartz or metal is provided at the bottom of the process tube 12, and a flange 64 is provided at the upper edge thereof. This flange 64 is fixed in an airtight manner to the process tube 12, which is constructed of a material such as quartz, by a sealing means such as an O-ring 62. The manifold 60 is provided with first gas introduction holes 26 and first gas exhaust holes 27, for the purpose of operations such as evacuating the interior of the process tube 12 or purging it with nitrogen, and for the purpose of introducing gas into interior of the process tube 12 and exhausting it therefrom. In this case, the first gas exhaust holes 27 are provided in such a manner that they exhaust process gases from the space surrounding the gap between the process tube 12 and the inner tube 13 and pass through the process tube 12, the thermal insulation material 14, the inner shell 20, and the outer shell 24. This is intended to ensure that the flow of process gas introduced into the process tube 12 can be configured in an appropriate manner, and thus the thin film formed on the wafer 28 can be made uniform. Note that the inner surface of the metal manifold 60 in contact with the process tube 12 is covered by a material designed to be able to cope with heavy metal contamination, such as quartz. In addition, the outer wall of the metal manifold 60 is provided with cooling tubes 66 in which a cooling medium such as cold water circulates, in order to cool the metal manifold 60.

The shutter drive section 30 is configured as described below.

In this embodiment, a plurality of shutter stages is provided at a plurality of different places in the longitudinal axial direction in a lower end opening 10a of the thermal processing section 10, such as a thermal insulation shutter 32 and a thermal insulation shutter 36. Each shutter 32 and 36 has a pair of shutter plates 32a and 32b, and 36a and 36b, that are driven horizontally in mutually different directions, such as linearly.

The shutter plates 32a, 32b, 36a, and 36b are preferably configured of a thermal insulation material and have a thermal insulation function such as to ensure that the quantity of heat added to within the process tube 12 is kept constant, minimizing changes therein. In this case, at least the upper shutters (in other words, the pair of shutter plates 32a and 32b of the first thermal insulation shutter 32) are preferably configured in such a manner as to be molded of a thermal insulation material such as quartz, with a structure such that the periphery of something like a heater is covered with a quartz wall, so as to provide the shutter plates with a temperature regulating function (not shown). With this configuration, it is possible to form a suitable temperature gradient between the flat heat generation source 18 and the shutters provided with this thermal regulating function during the thermal processing, and also prevent contamination by substances such as heavy metals during the thermal processing. In this case, the temperature gradient can be maintained as appropriate by means such as feedback of the heater temperature obtained by a means such as a sensor, so that the temperature can be controlled to, for instance, between 300° C. and 800° C. The lower, second, pair of shutter plates 36a and 36b of the thermal insulation shutter 36 are preferably configured in such a manner as to be molded of a thermal insulation material such as quartz, with a structure such that the periphery of something like a cooling jacket is covered with a quartz wall, so as to provide the shutter plates with a cooling function (not shown). This turns the space below the thermal insulation shutter 36 into a low-temperature region which could be a room-temperature region. Note that in this case a medium such as ammonia, ion disulfide, or water can be used as the cooling means. It is preferable to use the latent heat of this cooling medium to provide cooling to a temperature of between 100° C. and 400° C., for example.

Figure 3A:
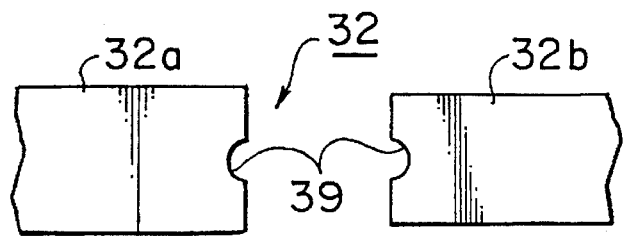
FIGS. 3A–3C illustrate different configurations of thermal insulation shutters according to an embodiment of the invention.

The leading edge of each of the pair of shutter plates 32a and 32b forming the first thermal insulation shutter 32 is configured to have a shape such as a semicircular cutout section 39 through which a elevator shaft 116 can pass, as shown in FIG. 3A. The pair of shutter plates 32a and 32b can take up any of the three configurations shown in FIGS. 3A to 3C.

Figure 3B:
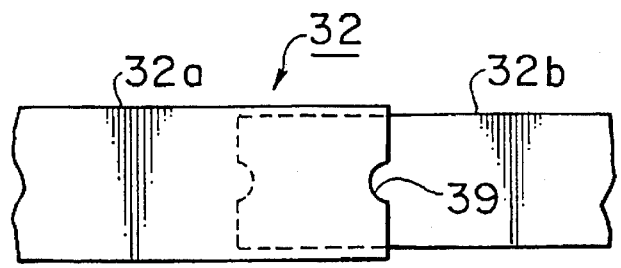
Figure 3C:
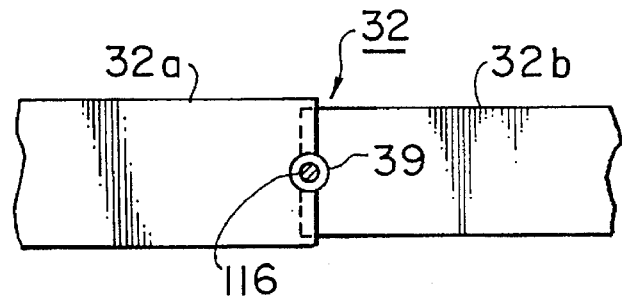

FIG. 3A shows the shutter 32 in an open configuration. The pair of shutter, plates 32a and 32b can reach a locked-close configuration by both of them overdriving past a central position, as shown in FIG. 3B. In this case, when the shutter's plates are in the overdriven configuration, it is preferable that the shutter plate 32a, which is on top, and the shutter plate 32b, which is below, are as close to each other as possible. In addition, the two cutout sections 39 are configured such that the elevator shaft 116 can pass freely therebetween when the plates are in the closed configuration shown in FIG. 3C wherein the leading edges of the shutter plates 32a and 32b are each overdriven slightly past a central position. Note that the pair of shutter plates 36a and 36b of the second thermal insulation shutter 36 have exactly the same structure as that of the above-described pair of shutter plates 32a and 32b.

The shutter plates 32a, 32b, 36a, and 36b are, as shown in FIG. 1, linked together by cylinder rods 42. Each cylinder rod 42 is freely driven horizontally by a drive mechanism such as an air cylinder, to enable control over the opening and closing of the first thermal insulation shutter 32 and the second thermal insulation shutter 36. A bellows 40 is provided in a airtight manner between each cylinder rod 42 and a flange 43, to ensure that the interior of the apparatus is, as far as possible, sealed in an airtight manner from the outer atmosphere while the shutters are opening and closing. In this case, it is preferable that each bellows 40 is configured of a double-walled structure having an outer tube and an inner tube, as will be described later. In addition, it is preferable that the space between the outer tube and the inner tube is configured so as to be filled with an inert cooling gas, to increase the longevity, anti-corrosion, and safety characteristics of the bellows.

A second gas introduction hole 44 is provided in the space between the shutter mechanism formed of the shutter plate 32b and the shutter plate 36b, and a second gas exhaust hole 46 is provided in the space between the shutter mechanism formed of the shutter plate 32a and the shutter plate 36a. The second gas introduction hole 44 and the second gas exhaust hole 46 are mainly used for the purpose of operations such as evacuating an inter-shutter space 48 or purging it with nitrogen, the inter-shutter space 48 being the gap between the upper and lower shutters when both the first thermal insulation shutter 32 and the second thermal insulation shutter 36 are in the configuration shown in FIG. 3B.

The wafer conveyor section 70 is configured as described below with reference to FIG. 1.

The wafer conveyor section 70 is mainly configured of a first load lock chamber 80 and a second load lock chamber 90, each designed to convey wafers 28 from respective wafer carriers 28a and 28b while maintaining a airtight sealed status with respect to the atmosphere, and a reception chamber (preliminary vacuum chamber) 100, designed to receive a wafer transferred thereto and pass it on into the process tube 12.

The first load lock chamber 80 is provided with a first gate valve 82, a second gate valve 83, a conveyor arm 84, a third gas introduction hole 86, and a third gas exhaust hole 88. Similarly, the second load lock chamber 90 is provided with a third gate valve 92, a fourth gate valve 93, a conveyor arm 94, a fourth gas introduction hole 96, and a fourth gas exhaust hole 98. The gate valves 82, 83, 92, and 93 have an opening and closing function such that each opens as appropriate when a wafer 28 is being conveyed between the wafer carriers 28a and 28b and the corresponding load lock chambers 80 and 90, or between the load lock chambers 80 and 90 and the reception chamber 100, and close when an airtight sealed status is being maintained. The conveyor arms 84 and 94 are configured of arms having, for example, a multi-jointed structure, and they have the function of conveying wafers from the wafer carriers 28a and 28b into the corresponding load lock chambers 80 and 90, and from the load lock chambers 80 and 90 into the reception chamber 100. The third and fourth gas introduction holes 86 and 96 are designed to enable a nitrogen purge of the corresponding load lock chambers 80 and 90, and the third and fourth gas exhaust holes 88 and 98 are designed to enable evacuation of the load lock chambers 80 and 90.

The reception chamber 100 is designed to receive each wafer 28 and transfer it into the process tube 12, and is provided with a fifth gas introduction hole 102 for purposes such as nitrogen purge and a fifth gas exhaust hole 104 for purposes such as evacuating the reception chamber 100.

The wafer elevator section 110 is configured as described below.

The wafer elevator section 110 is designed to move the wafer 28 relatively with respect to the flat heat generation source 18 by driving, by means of an elevator mechanism 112, an elevator arm 114 linked to the elevator shaft 116 to convey the wafer 28 supported on a wafer support 118 provided on the leading end of the elevator shaft 116, into the process tube 12. This enables the wafer 28 to be subjected to rapid thermal processing.

As shown in FIG. 1, the elevator shaft 116 is provided with the wafer support 118 which enables the wafer 28 to be supported. The elevator shaft 116 and the wafer support 118 are preferably constructed of a material that has superior thermal resistance and does not cause much contamination, such as quartz or high purity silicon carbide. High purity silicon carbide is particularly preferable because it has far better thermal resistance properties than quartz and can withstand high temperatures of about 1200° C., and is thus optimal as a material used in such a thermal processing apparatus.

The wafer support 118 is constructed in such a manner as to have three or four of support protrusions 119, as shown for example in FIG. 1, formed integrally therewith. These support protrusions 119 come into contact with the rear surface of the wafer 28, thus enabling the wafer 28 to be stably supported horizontally.

The elevator shaft 116 is preferably linked to a rotational mechanism (not shown) that could be provided on top of the elevator arm 114, and it can be freely rotated by means of this rotational mechanism. This rotation enables uniform thermal processing of the wafer supported on the elevator shaft 116 by the flat heat generation source 18 and a process gas introduced through the first gas introduction holes 26.

The shutter drive section 30 and the wafer elevator section 110 are connected to a control device that is connected to a memory. A thermocouple is placed against a wafer 28 which is supported on the wafer support 118, to measure its temperature, the resultant data is stored in the memory, and the control device can reproduce this data to raise and lower the wafer support 118 and drive the thermal insulation shutters 32 and 36.

Figure 2:
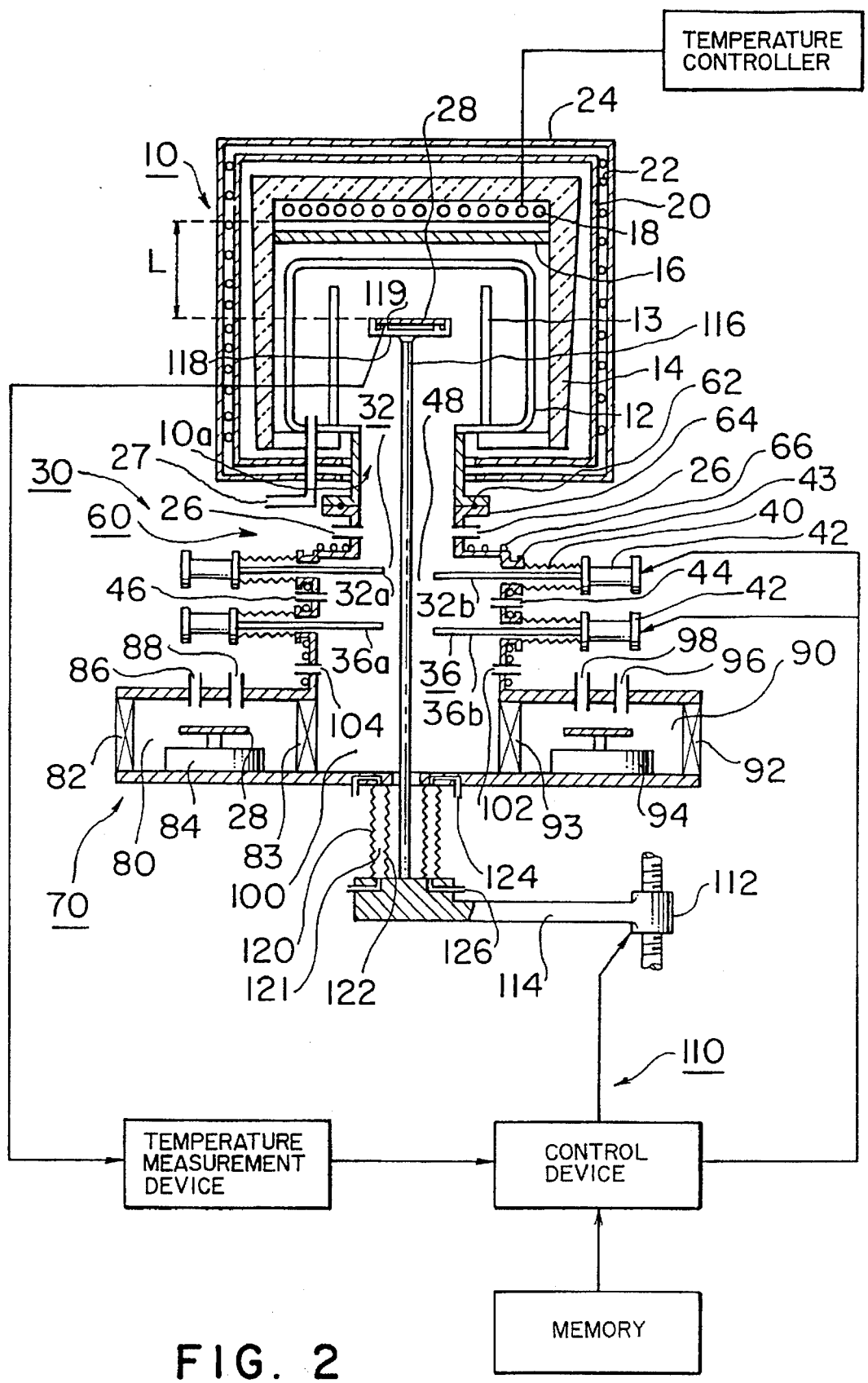
FIG. 2 is an abbreviated lateral cross-sectional view of a variation on the thermal processing apparatus of FIG. 1.

The wafer support 118 shown in FIG. 2 may be provided with a thermocouple to directly measure the temperature of the wafer 28, and closed-loop feedback temperature control may be provided on the basis of the results of this measurement.

The elevator arm 114 and the elevator shaft 116 formed integrally therewith can be raised and lowered at high speed by the elevator mechanism 112, thus ensuring that the wafer 28 can be subjected to rapid thermal processing. In this case, the interior of the process tube 12 of this embodiment should be sealed in an airtight manner from the outer atmosphere, and a bellows formed of a double-walled structure of an outer tube 120 and an inner tube 122 is provided between the elevator arm 114 and the lower part of the reception chamber 100. The inner tube 122 is preferably formed of a material with excellent thermal resistance, durability, anti-contamination, anti-corrosion, and high-sealing characteristics, such as silicon carbide or Teflon. The outer tube 120 is preferably formed of a material with superior durability and thermal resistance characteristics such as stainless steel. The main function of the outer tube 120 is to act as a temporary protective sleeve if the inner tube 122 should break before it is exchanged after a regular maintenance period, such as one or two years.

A gap 121 between the outer tube 120 and the inner tube 122 is preferably fillable with an inert gas such as nitrogen or argon. In this case, an inert filler gas is used because, even if this gas should escape into the apparatus, it will not have any adverse effect on the thermal processing. Sixth gas introduction holes 124 introduce the gas into the gap 121, and sixth gas exhaust holes 126 release the gas therefrom into the atmosphere. It is also preferable to provide some means for detecting the pressure in the gap 121, such as a gas sensor (not shown). This gas sensor could either be one that detects the pressure directly, or it could be one that detects the leakage of the process gas or other gas, such as a PPM sensor.

In this embodiment, a pressure P1 within the apparatus and a pressure P2 within the gap 121 are simultaneously controlled in the manner shown below by way of example.

In other words, while the wafer 28 is being conveyed, these pressures could be controlled such that:

$$P1 \leq P2 < \text{outer atmosphere}$$

to ensure that, if a pinhole should occur in the inner tube 122 of the bellows, leakage of the process gas in the apparatus can be prevented. While the wafer 28 is being thermally processed, these pressures could be controlled such that:

$$P1 > P2$$

to ensure that, if a pinhole should occur in the inner tube 122 of the bellows, there is no danger of gas within the gap 121 entering into the apparatus, and thus adverse effects on the processing of the wafer 28 can be prevented.

The operation of thermal processing of a workpiece, using the apparatus of the present embodiment, will now be described.

First, as shown in FIG. 1, wafers 28 are conveyed from each of the wafer carriers 28a and 28b to the corresponding load lock chambers 80 and 90. This explanation deals with the case in which the second load lock chamber 90 is used. When the wafer 28 is conveyed thereinto, the second load lock chamber 90 is first purged with nitrogen through the fourth gas introduction hole 96 to bring the interior of the second load lock chamber 90 to the same pressure as the outer atmosphere. By making the pressure in the load lock chamber the same as that of the outer atmosphere, scattering caused by the sudden flow of dirt and dust rushing in from the atmosphere when the third gate valve 92 is opened can be prevented. Next the third gate valve 92 is opened, and the wafer 28 is conveyed into the second load lock chamber 90 from the wafer carrier 28b by the conveyor arm 94. Thereafter, the third gate valve 92 closes, the load lock chamber is evacuated through the fourth gas exhaust hole 98, then nitrogen is introduced through the fourth gas introduction hole 96 to perform a nitrogen purge. At this point, it is preferable that the reception chamber 100 has already been evacuated and purged with nitrogen through the fifth gas exhaust hole 104 and the fifth gas introduction hole 102, respectively. In addition, as described above, the pressure within the second load lock chamber 90 and that within the reception chamber 100 are regulated such that they are the same, to ensure that scattering due to dirt and dust does not occur when the fourth gate valve 93 is opened. In this case, the pressures in the process tube 12 and the inter-shutter space 48 are made to be the same as that of the load lock chamber by evacuating them through the corresponding gas exhaust holes 27 and 46 and purging them with nitrogen through the corresponding gas introduction holes 26 and 44. Next, the fourth gate valve 93 is opened, and the wafer 28 is conveyed into the reception chamber 100 by the conveyor arm 94. At this point, the wafer support 118 has already been positioned in the reception chamber 100 by the elevator mechanism 112, and the conveyed wafer 28 is then placed in alignment with the support protrusions 119 provided on the wafer support 118. In this case, both pairs of shutter plates 32a and 32b, and 36a and 36b, are in the configuration shown in FIG. 3B, and the interiors of the process tube 12 and the reception chamber 100 are in a thermally isolated state.

Next the pair of shutter plates 36a and 36b are opened to the configuration shown in FIG. 3A. In this configuration, the temperature of the shutter plates 32a and 32b is regulated by a heater, which could be incorporated in the shutter plates 32a and 32b.

The wafer 28 is then raised by the elevator shaft 116, and it is placed in the inter-shutter space 48. Subsequently, the pair of shutter plates 36a and 36b are closed to the configuration shown in FIG. 3C.

The pair of shutter plates 32a and 32b are then opened to the configuration shown in FIG. 3A. The wafer 28 is raised by the elevator shaft 116, then the pair of shutter plates 32a and 32b are closed to the configuration shown in FIG. 3C.

In this way, since at least one of the upper first thermal insulation shutter 32 and the lower second thermal insulation shutter 36 of the apparatus of this embodiment of the present invention is closed while the wafer 28 is being conveyed inward, thermal insulation is enabled. This means that the amount of heat added to the process tube 12 can be kept constant while the wafer 28 is conveyed thereinto.

Then the wafer 28 is moved into the process tube 12 and thermal processing starts. In this embodiment, the wafer 28 is thermally processed by means of the elevator mechanism 112 bringing it rapidly into close proximity with the flat heat generation source 18.

If this sort of thermal processing method is used, the radiant heat from the flat heat generation source 18 is directed virtually perpendicularly onto the surface of the wafer 28 that is being thermally processed to ensure that heating can be applied at a uniform temperature over the entire surface of the wafer 28 that is being thermally processed, even if the wafer 28 has a large outer diameter such as 12 inches. In addition, since the rate at which the wafer 28 is heated can be controlled by the rate at which it is brought into the vicinity of the flat heat generation source 18, rapid thermal processing at any desired rate of temperature increase can be achieved by increasing the speed at which the wafer 28 is brought into the vicinity of the heat source.

As a result, this embodiment first of all enables rapid thermal processing, and thus it achieves superior results by enabling various thermal process that achieve the formation of ultra-thin films such as gate oxide films and capacitor isolation films by 50 to 100 Å doping, as well as shallow PN junctions of 0.1 μm or less. Despite this rapid heating, there is none of the slippage, distortion, and warping of the surface of the wafer 28 that is usually caused by non-uniformity of the temperature distribution, because the thermal distribution within the surface of the wafer 28 can be kept uniform. A further advantage, independent of the achievement of these superior characteristics, concerns the way in which the bellows, which is usually subjected to the most extreme of variations over time, is configured of the outer tube 120 and the inner tube 122. This is a construction that is not easily contaminated by process gases, enabling the realization of a thermal processing apparatus that has good durability characteristics during use over long periods of time.

The rate at which the wafer 28 is brought into close proximity with the flat heat generation source 18 is preferably such that the rate at which the temperature of the surface of the wafer 28 rises is at least 20° C./s, more preferably 100° C./s (second). More specifically, the rate at which the wafer is brought into close proximity is preferably at least 50 to 200 mm/s. This embodiment also enables the operator to perform several different thermal processes at different temperatures, by varying the setting value of the minimum separation distance L between the wafer 28 and the flat heat generation source 18. This enables the convenient selection of a high-temperature thermal processing at, for example, 1200° C., or a low-temperature thermal processing at, for example, 500° C., and thus enables compound processing. In this case, the "minimum separation distance" is the distance to the flat heat generation source 18 from the wafer 28 when it has been stopped and come to rest at the prescribed position for thermal processing.

Note that, when raising the heated temperature of the wafer 28 brought into proximity with the flat heat generation source 18 above the wafer 28, the wafer 28 is positioned somewhat higher than the position of this minimum separation distance L at, for example, about 10 mm thereabove, then, after the heated temperature of the wafer 28 has reached the prescribed value and stabilized thereat, the wafer 28 is positioned at the minimum separation distance L for processing. This enables an increase in the throughput, which is one of the technological concerns of a multi-wafer type of thermal processing apparatus.

Next, once the thermal processing of this wafer 28 has finished, the wafer 28 is returned to the reception chamber 100 by reversing the above-described procedure. During this process, at least one of the upper first thermal insulation shutter 32 and the lower second thermal insulation shutter 36 is kept in a closed configuration, even when the wafer 28 is returned. This ensures thermal insulation, and thus the wafer 28 can be conveyed while keeping the amount of heat added to the process tube 12 constant. Finally, the wafer 28 is conveyed out of the apparatus from the reception chamber 100, and is held on the wafer carrier 28b. Next, a wafer 28 that has already been mounted in, for example, the first load lock chamber 80 is conveyed into the reception chamber 100, and thus wafers 28 can be conveyed one by one into the process tube 12 as described above, and thermally processed therein.

Note that, since this embodiment provides a plurality of load lock chambers 80, 90, a wafer 28 that was introduced through the first load lock chamber 80, for example, can be thermally processed in the process tube 12 while another wafer 28 is being conveyed ready for processing into the second load lock chamber 90 by the above-described method, thus increasing the processing throughput.

In the embodiment described above, a stable thermal insulation configuration can be enabled between the process tube 12 and the reception chamber 100, even while wafers 28 are being conveyed into and out of the apparatus. Therefore, the amount of heat added to the interior of the process tube 12 can be minimized and can also be kept stable. Thus, once a certain optimal temperature gradient has been established within the process tube 12, the time required to return the thus-formed temperature gradient to its original state and the necessary energy therefor can be minimized, even while a series of wafers 28 are being brought into the apparatus in sequence. This is intended to enable an increase in the processing throughput, which is a major technological concern with multi-wafer types of processing furnaces, and also enable reductions in the power used by the apparatus and the construction costs thereof.

EMBODIMENT 2

Figure 4:
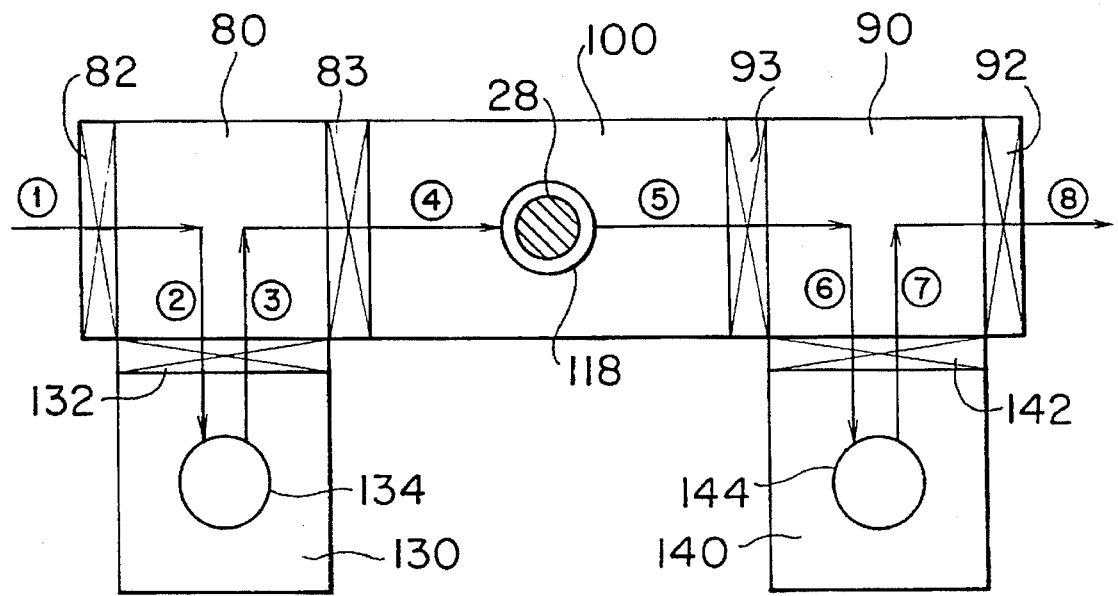
FIG. 4 is an abbreviated plan view illustrating a second embodiment of a thermal processing apparatus according to the present invention.

A second embodiment of the present invention will now be described with reference to FIG. 4.

This embodiment is intended to further increase the throughput of the apparatus by pre-heating the wafer 28 before it is conveyed into the reception chamber 100, and by cooling the wafer 28 before it is conveyed out of the reception chamber 100 and out of the apparatus. For these reasons, a heating chamber 130 and a cooling chamber 140 are provided in the apparatus of the above-described Embodiment 1. In this case, the heating chamber 130 is positioned so as to be connected via a fifth gate valve 132 to the first load lock chamber 80, for example, and the cooling chamber 140 is positioned so as to be connected via a sixth gate valve 142 to the second load lock chamber 90.

A heating stage 134 is provided in the heating chamber 130. This heating stage 134 has the function of pre-heating the wafer 28 to a suitable temperature, such as 300° C. to 400° C., before the wafer 28 is conveyed out into the reception chamber 100. The wafer is preferably heated by a lamp-heating method using, for example, a halogen lamp, or by using a hot plate. In this case, if the heating is done by using a hot plate, either a method of heating the wafer by placing the surface of the wafer in contact with the hot plate, or a proximity method of heating it while it is spot-contact with the hot plate, can be used. Note that the hot plate should be configured of a material such as quartz, to ensure that contamination by heavy metals, for instance, is prevented.

A cooling stage 144 is provided in the cooling chamber 140. This cooling stage 144 has the function of pre-cooling the wafer 28 to within, for example, a range of 300° C. of room temperature, before the wafer 28 is conveyed out of the apparatus. If the wafer 28 is cooled in this way before it is conveyed out of the apparatus, unwanted oxide films that would occur by natural oxidation on the wafer 28 can be prevented from forming when the wafer 28 is conveyed out of the apparatus. The cooling method used for this purpose could be one using a cooling gas, one using a cooling jacket utilizing a cooling medium, or one using cold plates. In this case, a substance such as ammonia, ion disulfide, or water can be used as the cooling medium, and cooling can be achieved by using the latent heat of this cooling medium. If heating is by cold plate, a method of cooling can be used in which the wafer 28 is brought into surface contact with a cold plate, or a proximity method in which the wafer is cooled in a state where it is in point contact with the cold plate.

The operation of Embodiment 2 will now be described.

First the wafer 28 is conveyed into the first load lock chamber 80 from outside the apparatus, as shown by arrow ①. The operation in this case is the same as the conveying method of the above-described Embodiment 1. Next, after the pressure is made the same as that of the first load lock chamber 80 by evacuating the heating chamber 130 and purging it with nitrogen through gas exhaust holes and gas introduction holes (not shown), the fifth gate valve 132 is opened and the wafer 28 is conveyed into the heating chamber 130 as shown by arrow ②.

Then the fifth gate valve 132 is closed and the wafer on the heating stage 134 is heated to a temperature between, for example, 100° C. and 400° C. Next, the wafer 28 is conveyed out into the first load lock chamber 80 through the fifth gate valve 132. At this point, a wafer that has already completed thermal processing in the previous cycle of the thermal processing section 10 is conveyed out into the second load lock chamber 90.

Next, the wafer 28 is conveyed out into the reception chamber 100 through the second gate valve 83, as shown by arrow ④, and the wafer 28 is installed on top of the wafer support 118. One of various types of thermal processing is then performed on the wafer 28 by one of the methods described above. In this case, since the wafer 28 has already been heated to between 100° C. and 400° C., the thermal processing throughput of the flat heat generation source 18 can be greatly improved.

Once the thermal processing is completed, the wafer 28 is conveyed out into the cooling chamber 140 through the gate valves 93 and 142, as shown by arrows ⑤ and ⑥. It is then cooled in the cooling chamber 140, using the cooling stage 144, to a temperature within the range of, for example, 300° C. to room temperature. Then the wafer 28 is conveyed out of the apparatus through the gate valves 142 and 92, as shown by arrows ⑦ and ⑧. In this case, since the wafer 28 has already been cooled, phenomena such as the formation of unwanted oxide films created by contact with the atmosphere outside the apparatus can be avoided.

For example, in this embodiment, the process tube 12 has a double-walled tubular structure, and this structure is used to introduce the process gas, but the present invention is not limited to this structure. For example, the construction could be such that the process gas introduction holes are of a nozzle form, the process gas is introduced from the lower part or sides of the process tube 12, and the process gas flows onto the wafer 28. Another example is that the construction could be such that the process gas introduction holes are provided in the upper part of the process tube 12, for example in the center thereof. If such a construction is used, the flow of the process gas can be made into a completely downward flow with respect to the wafer 28, which has the advantageous effects of improving the uniformity of film thickness and improving film quality.

The shutter plates 36a and 36b that configure the second thermal insulation shutter 36 are not limited to a configuration wherein the surfaces are of a substance such as quartz. They could be configured of stainless steel, for example.

In addition, the workpiece that is to be processed by the apparatus relating to the present invention can be any workpiece that has at least a planar shape, and is not limited to a semiconductor wafer. It could be, for example, an LCD. The thermal processing to which the present invention is applied could be other than such as CVD; it could be oxidation, diffusion, or annealing.

According to the present invention described above, the region opposite the lower end opening of the apparatus is further isolated by at least one of the thermal insulation shutters, even when workpieces to be processed are conveyed into and out of a longitudinal thermal processing furnace, so that variations in the amount of heat added to the processing area can be kept very small.

EMBODIMENT 3

A third embodiment of the present invention, relating to a multi-wafer type of thermal processing apparatus suitable for performing oxide diffusion processing on semiconductor wafers, will now be described.

Figure 5:
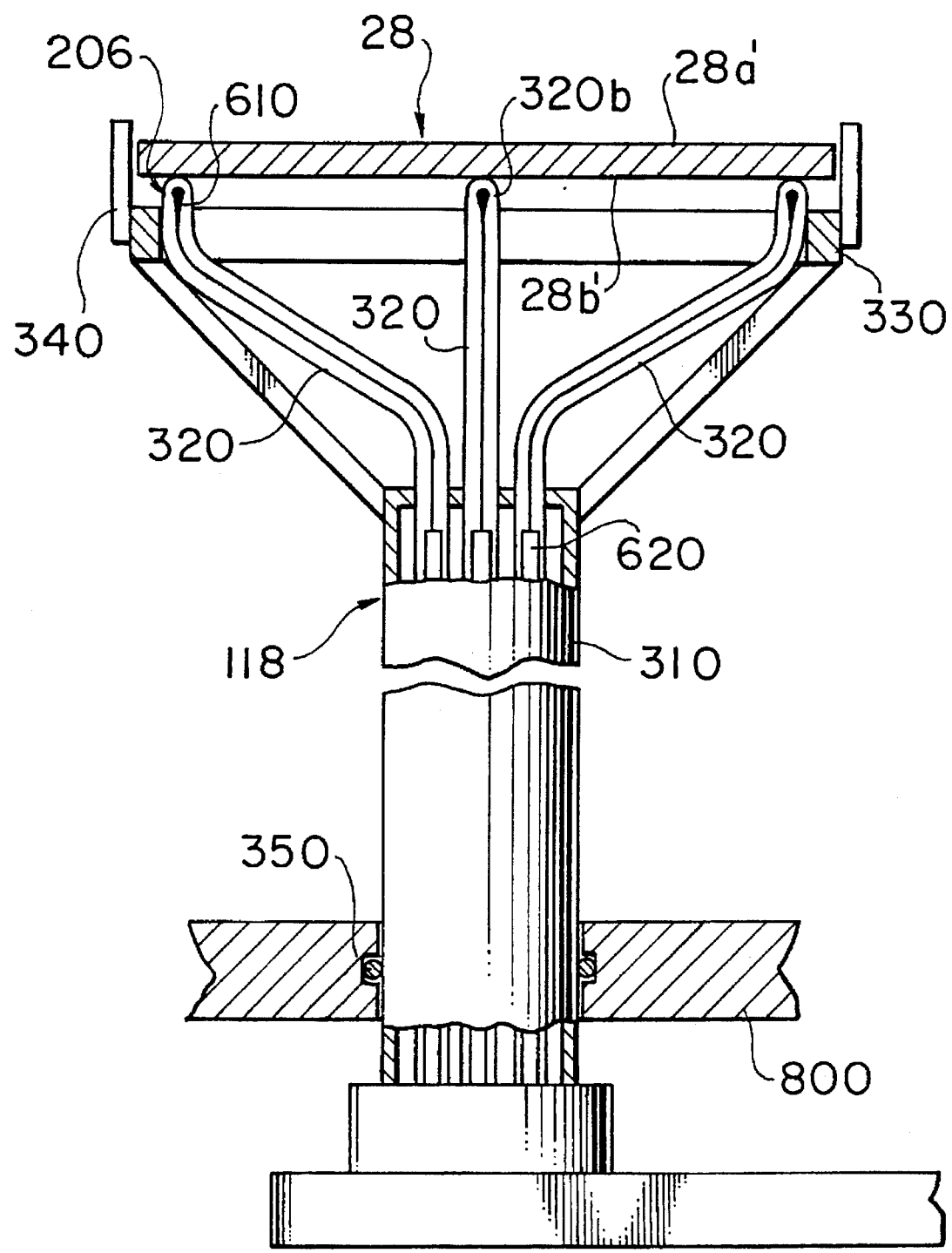
FIG. 5 is a partially cutaway side view of a wafer support used in a third embodiment of a thermal processing apparatus according to the present invention.

Embodiment 3 uses the characteristic structure shown in FIG. 5 as the wafer support 118.

In other words, the wafer support 118 of this embodiment is provided with a small-diameter support column 310; at least three small-diameter tubular support sections 320, each extending from out of the interior of the support column 310 and having a closed end section 320b; and at least three positioning sections 340. Reference number 330 denotes an annular auxiliary strengthener section that is provided if necessary. This auxiliary strengthener section 330 is connected to the free ends of the support sections 320 and the positioning sections 340 are fixed to the auxiliary strengthener section 330.

A temperature detection means 206 of this embodiment is provided with a temperature sensor 610 that is arranged in contact with the inner wall of the closed end section 320b of each small-diameter tubular support section 320 of the wafer support 118; and a wiring section 620 that is connected to the temperature sensor 610, passes through the small-diameter tubular support section 320, then is connected to an external control circuit (not shown).

A wafer 28 is held with a rear surface 28b' thereof in contact with the closed end sections 320b of the support sections 320. The shape of each closed end section 320b can be rounded, flat, or tapered.

In the thermal processing apparatus of this embodiment, the wiring section 620 of each temperature sensor 610 is arranged so as pass within the corresponding small-diameter tubular support section 320 of the wafer support 118, so it suffers no damage when the wafer support 118 is moved. Therefore, the temperature of the wafer 28 can be measured smoothly, not only while the wafer 28 is at rest, but also while it is being raised or lowered.

EMBODIMENT 4

The operation of a fourth embodiment will now be described, with reference to oxide diffusion processing on semiconductor wafers by the thermal processing apparatus of the present invention.

In this embodiment, a cylindrical process tube 12 that has at one end thereof an entrance/exit 11a is provided at the other end thereof with a heat generation source 18, and a wafer 28 is brought from the entrance/exit 11a of the process tube 12 to a prescribed position L1. In the thermal processing of this method, when the wafer 28 is moved upward from a position below the process tube 12 to the prescribed position L1, it is first moved upward to a proximity position L2 that is closer to the heat generation source 18 than the prescribed position L1, as shown in FIG. 6, then it is moved downward to return to the prescribed position L1.

The prescribed position L1 is a position corresponding to the prescribed processing temperature and the proximity position L2 is a position corresponding to a temperature higher than the prescribed processing temperature. The distance between the prescribed position L1 and the proximity position L2 could be about 10 to 20 mm. The time during which the wafer is halted at the proximity position L2 could be about 1 to 3 seconds. Note that when the wafer 28 is moved upwards, it has preferably been pre-heated already.

Figure 6:
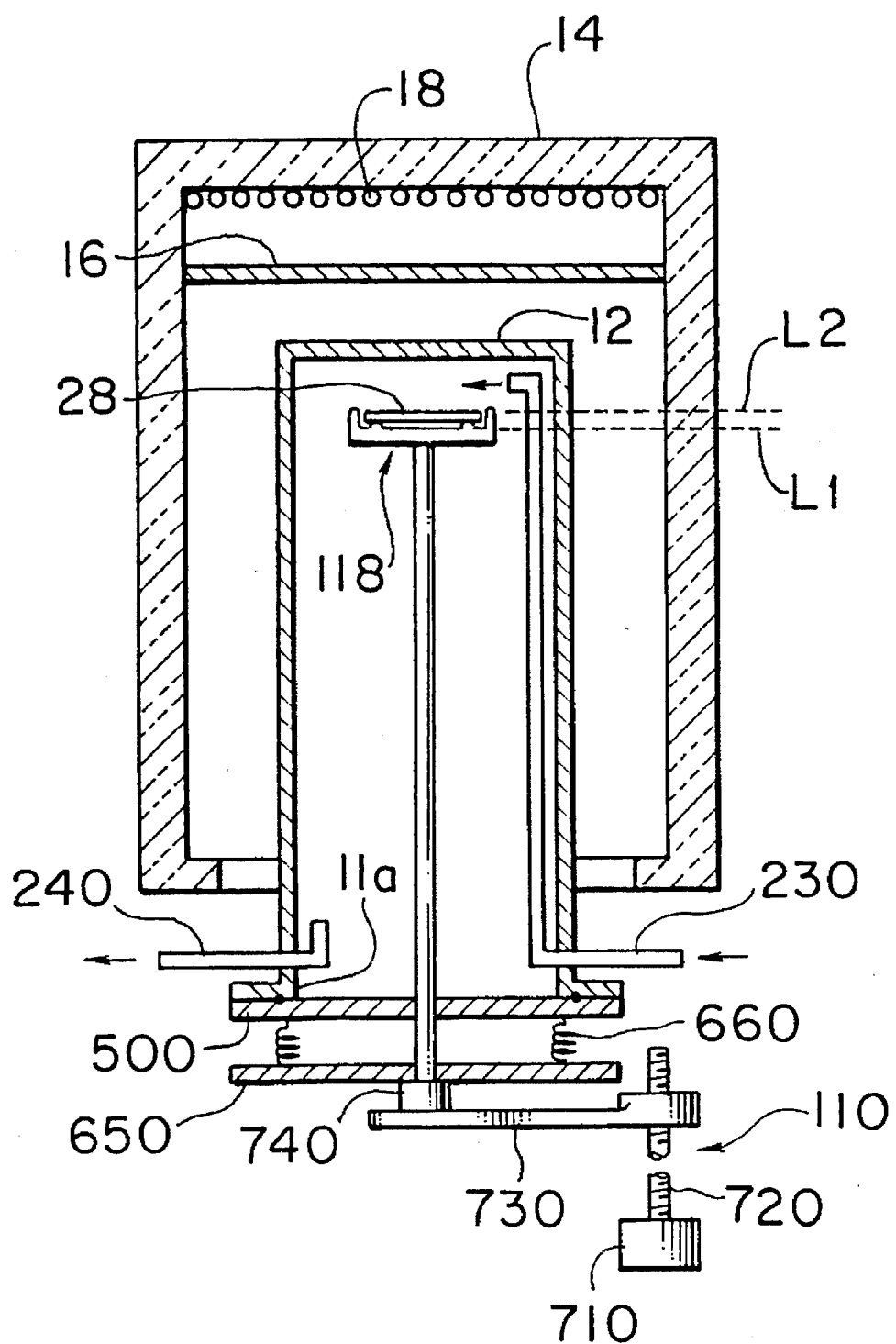
FIG. 6 is an abbreviated lateral cross-sectional view illustrating a fourth embodiment of the thermal processing apparatus according to the present invention.

In FIG. 6, reference number 118 denotes a wafer support, 16 denotes a thermal equalizer portion, 14 denotes a thermal insulation material, 500 denotes a lid portion, 110 denotes a movement means, 710 denotes a motor, 720 denotes a drive shaft, 730 denotes a drive arm, 740 denotes a rotational mechanism, 650 denotes a position adjustment portion, 660 denotes a spring, 230 denotes a gas introduction tube, and 240 denotes a gas exhaust tube.

The process tube 12 has a cylindrical shape and is made of an extremely thermally resistant material such as highly pure quartz ($SiO_2$). Its upper end is closed and its lower end has the entrance/exit 11a.

The heat generation source 18 is provided above the upper end of the process tube 12. It is fixed to the inner wall of the thermal insulation material 14 and directed toward the processing surface of the wafer 28, which has been positioned at the prescribed position L1 within the process tube 12.

While the wafer 28 is being heated in order to enable the heat processing, the rate of increase of the internal temperature of the wafer 28 is slower than that of the front surface thereof, so the wafer 28 held in the wafer support 118 is raised rapidly by the movement means 110 to the proximity position L2 that is further within the process tube 12 than the prescribed position L1, as shown in FIG. 6. Next, the wafer 28 is returned to the prescribed position L1 by the movement means 110. After the thermal processing, the wafer 28 held in the wafer support 118 is rapidly lowered by the movement means 110 out of the process tube 12.

The movement distance of the wafer support 118 is preferably about 300 to 600 mm, for instance, and its speed of movement is preferably 50 mm/s, or even higher.

The speed of movement of the wafer 28 could be constant, but it could be also initially high at about 250 mm/s then gradually decelerate.

In this embodiment, the arrangement is such that the position of the wafer 28 can be adjusted between the prescribed position L1 and the proximity position L2 by the position adjustment portion 650 and springs 660, in a configuration where the lid portion 500 closes off the entrance/exit 11a of the process tube 12.

The gas introduction tube 230 and the gas exhaust tube 240 are connected to the process tube 12, as shown in FIG. 6, so that process gas can be introduced thereinto and exhausted therefrom. During oxide diffusion processing, process gas is introduced into the process tube 12 from the gas introduction tube 230, it is heated by radiant heat from the heat generation source 18, and the temperature at the prescribed position L1 of the process tube 12 is controlled to stay at the prescribed processing temperature necessary for oxide diffusion processing, which is, for example, between 950° C. and 1200° C. When the wafer 28 is being raised or lowered, the temperature around the entrance/exit end of the process tube 12 is controlled by the radiant heat from the heat generation source 18 to be between 200° C. and 300° C.

The lid portion 500 is intended to close the entrance/exit 11a of the process tube 12 and keep it sealed during oxide diffusion processing, and open when the wafer 28 is entering or leaving the process tube 12.

Figure 8D:
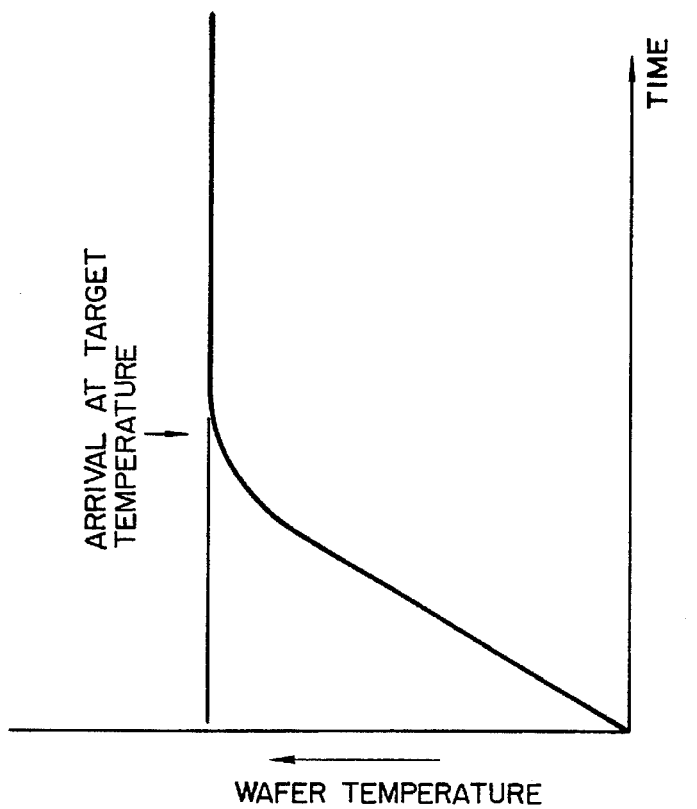
FIG. 8D is a graph showing wafer heating characteristics according to an embodiment of the present invention.
Figure 8C:
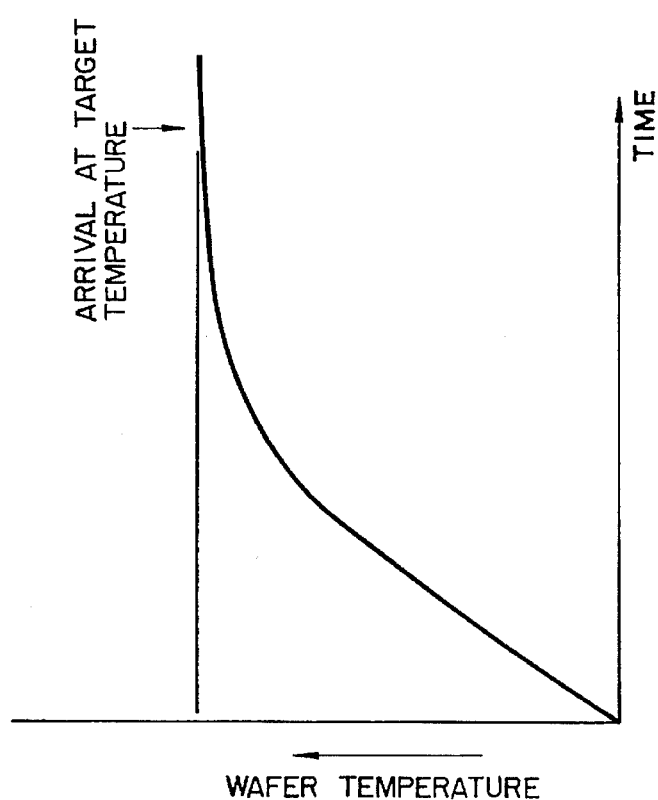
FIG. 8C is a graph showing conventional wafer heating characteristics.
Figure 9:
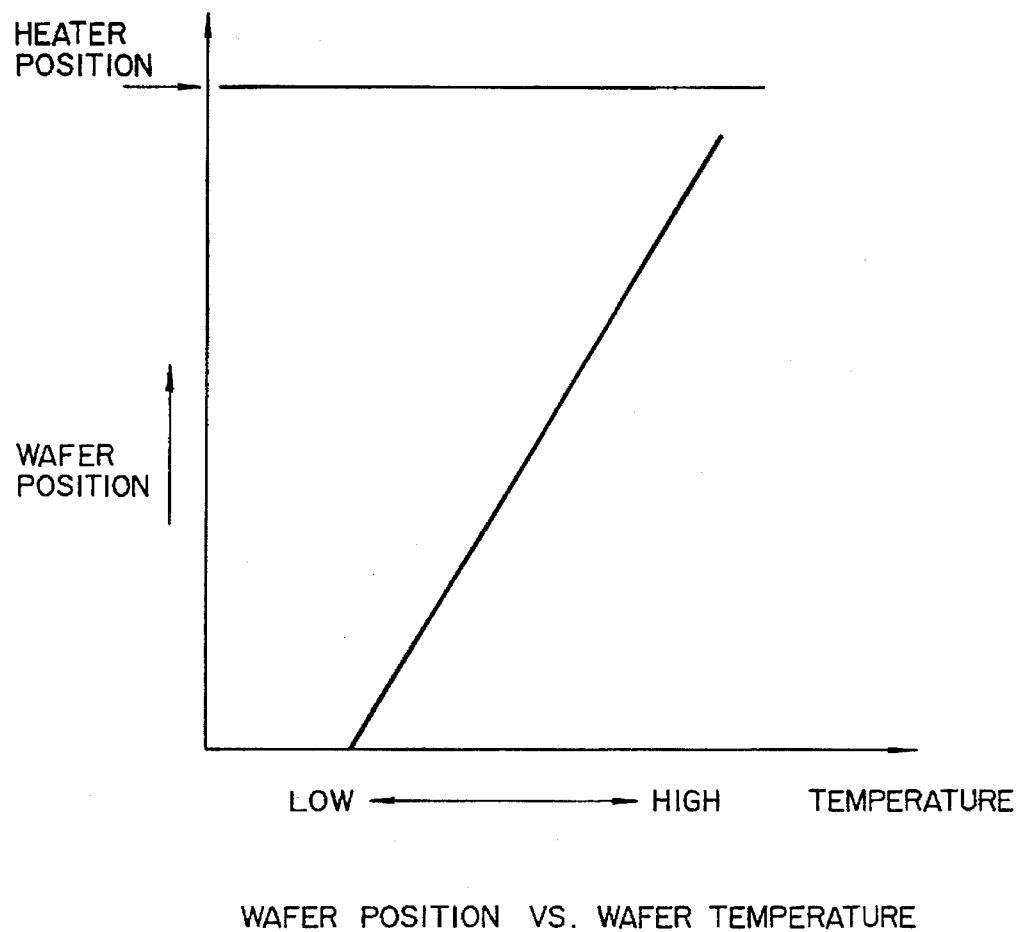
FIG. 9 is a graph illustrating the relationship between wafer position and wafer temperature.

In accordance with the thermal processing method of this embodiment, when the wafer 28 is moved to the prescribed position L1, it is first moved to a proximity position L2 closer to the heat generation source 18 than the prescribed position L1, as shown in FIG. 6, and, since wafer temperature rises the closer it is to the heater's position, as shown in FIG. 9, the temperature of the wafer 28 rapidly reaches a value close to the prescribed processing temperature, as shown in FIG. 8D then the wafer 28 returns to the prescribed position L1 and thus the temperature of the wafer 28 can rapidly stabilize at the prescribed processing temperature corresponding to the prescribed position L1.

EMBODIMENT 5

The operation of a fifth embodiment of the present invention, performing oxide diffusion processing on semiconductor wafers using a multi-wafer type of thermal processing apparatus shown in FIG. 7, will now be described.

Figure 7:
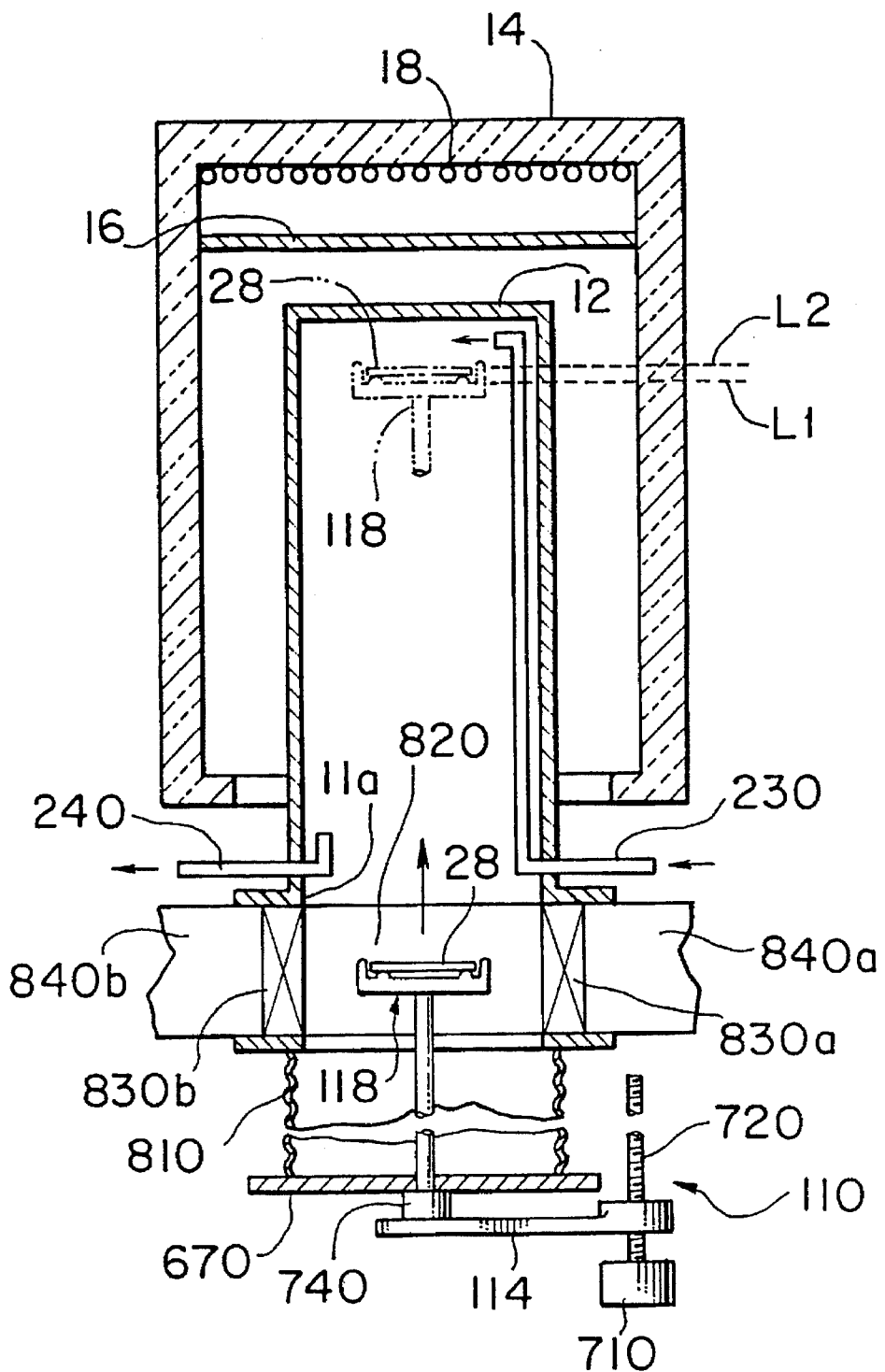
FIG. 7 is an abbreviated lateral cross-sectional view illustrating a fifth embodiment of the thermal processing apparatus of the present invention.

The thermal processing apparatus of FIG. 7 has a configuration such that the movement means 110 is arranged in the outer atmosphere and the wafer support 118 is arranged to be in the same atmosphere as the process tube 12 by means of a bellows-shaped tubular body 810. Reference number 670 denotes a tube attachment portion.

Reference number 820 denotes a processing preparation chamber which is provided at either end thereof with vacuum processing chambers 840a and 840b with respective gate valves 830a and 830b therebetween. The wafer 28 enters and leaves through the processing preparation chamber and vacuum processing chambers.

The bellows-shaped tubular body 810 is formed of a material such as silicon carbide (SiC), and it expands and contracts in accordance with the movement of the wafer support 118 by the movement means 110 to ensure that the wafer support 118 is always kept in a sealed atmosphere.

In the same way as described above, in this thermal processing apparatus too, when the wafer 28 is moved to the prescribed position L1, the temperature of the wafer 28 can be rapidly stabilized at the prescribed processing temperature by first moving it to a proximity position L2 closer to the heat generation source 18 than the prescribed position L1, then returning it to the prescribed position L1.

EMBODIMENT 6

Figure 10:
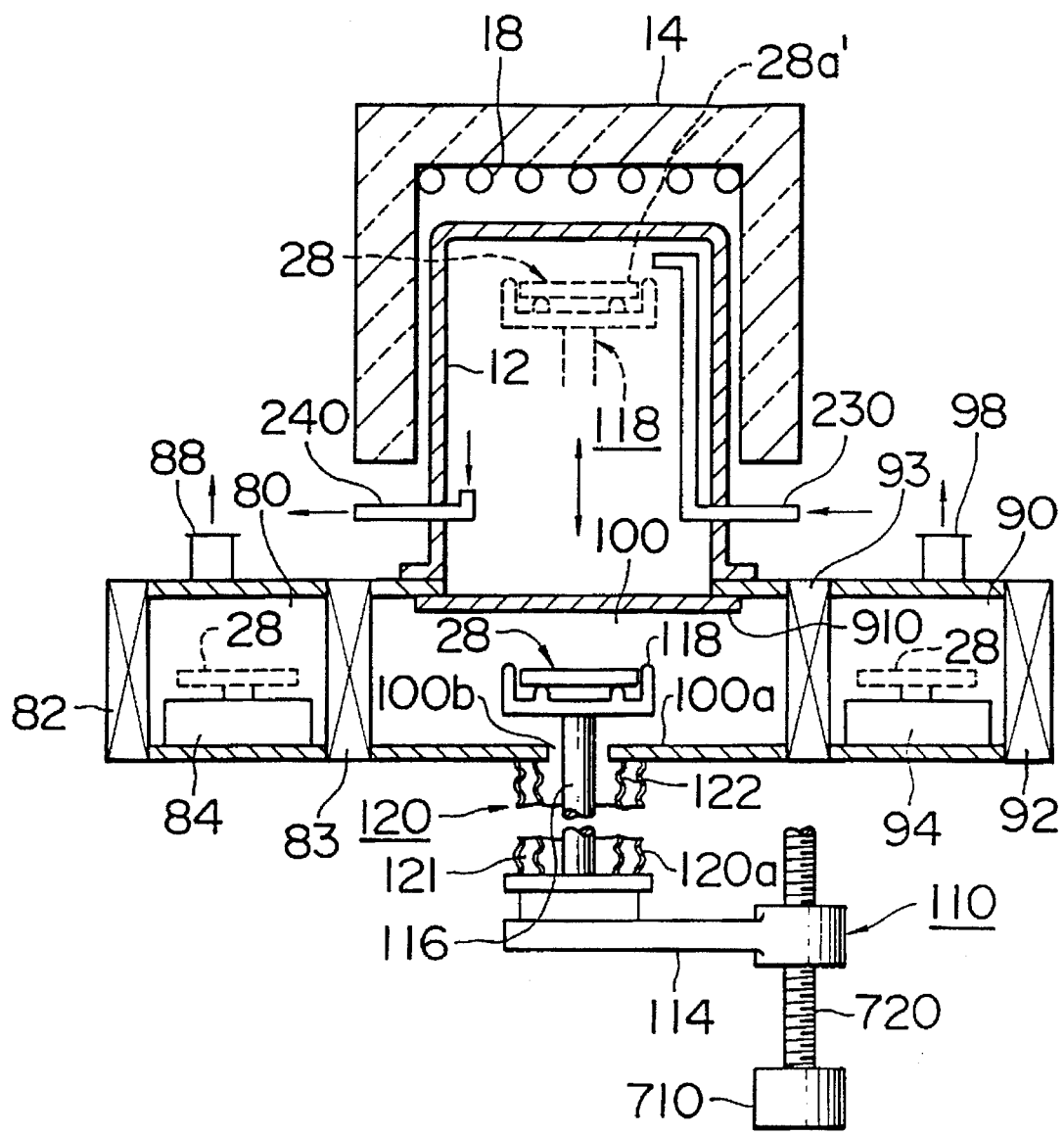
FIG. 10 is an abbreviated lateral cross-sectional view illustrating a sixth embodiment of the thermal processing apparatus according to the present invention.
Figure 11:
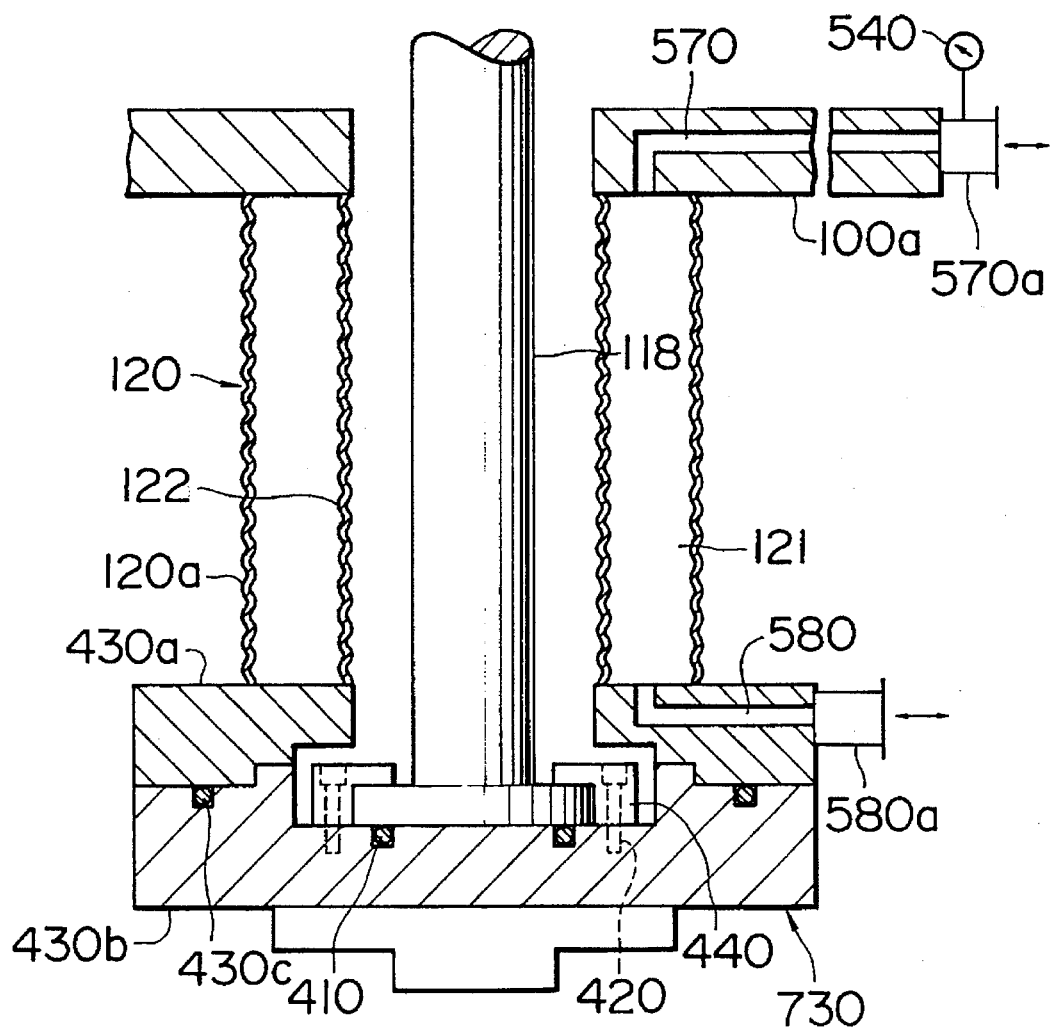
FIG. 11 is an expanded cross-sectional view of a bellows-shaped tubular body section of the thermal processing apparatus of FIG. 10.

An abbreviated cross-sectional view of a multi-wafer thermal processing apparatus of a sixth embodiment of the present invention is shown in FIG. 10, and an expanded cross-sectional view of main parts thereof is shown in FIG. 11.

Reference number 28 denotes a semiconductor wafer that is the workpiece, 12 denotes a process tube, 118 denotes a wafer support that is a device for holding the workpiece, 110 denotes an elevator mechanism, 120 denotes a bellows-shaped tubular body, 18 denotes a heat generation source, 14 denotes a thermal insulation material, 230 denotes a gas introduction tube, 240 denotes a gas exhaust tube, 910 denotes a lid portion, 82 denotes a gate valve, 100 denotes a processing preparation chamber (reception chamber), 80 and 90 denote vacuum preparation chambers, 84 and 94 denote semiconductor wafer conveyor means, and 98 denotes a gas exhaust tube.

The bellows-shaped tubular body 120 is mounted so as to cover the elevator shaft 116 of the wafer support 118 in the lower part of the processing preparation chamber (reception chamber) 100, and has a double-walled tubular structure comprising an inner tube 122 and an outer tube 120a.

The inner tube 122 is formed of a material with excellent thermal resistance, durability, anti-contamination, anti-corrosion, and high-sealing characteristics, such as silicon carbide (SiC) or Teflon (tradename).

One end of the outer tube 120a is fixed in an airtight manner to a lower wall 100a of the processing preparation chamber (reception chamber) 100 and the other end is fixed in an airtight manner to an actuator arm 114 of the wafer elevator mechanism 110.

Reference number 100b denotes a through hole that is provided in the lower wall 100a of the processing preparation chamber 100 and the processing preparation chamber 100 communicates with the bellows-shaped tubular body 120 through this through hole 100b.

The length of the bellows-shaped tubular body 120 is determined from consideration of the distance through which the wafer support 118 is raised and lowered. It could be, for example, between about 300 and 600 mm. Similarly, the inner diameter of the inner tube 122 is determined from consideration of the outer diameter of the wafer support 118, and could be, for example, about 50 to 60 mm. The dimension of the gap 121 between the inner tube 122 and the outer tube 120a could be, for example, about 10 to 20 mm.

The interior of this gap 121 is filled with an inert gas such as nitrogen ($N_2$) or argon (Ar) that will not adversely affect the interior of the process tube 12 if it should enter thereinto.

A gas sensor 540 is provided in the gap 121 to detect the gas pressure therein. This gas sensor 540 could either be one that detects the pressure directly, or it could be one that detects the leakage of the process gas or other gas, such as a PPM sensor. Reference numbers 570a and 580a denote gas introduction and exhaust tubes, and 570 and 580 denote gas flow passages.

This embodiment is such that the pressure within the process tube 12 and that within the gap 121 are controlled simultaneously.

The configuration of the wafer elevator mechanism 110 is the same as that of the other embodiments, except that the actuator arm 114 is, as shown in FIG. 11, configured of an upper plate 430a and a lower plate 430b, connected together in an airtight manner with an O-ring 430c therebetween.

The other end of the wafer support 118 is connected in an airtight manner to the lower plate 430b of the actuator arm 114 with an O-ring 410 therebetween. Reference number 440 denotes a fixing portion and 420 denotes a tightening means such as a bolt.

The thermal processing method in accordance with Embodiment 6 will now be described.

The thermal processing method of this embodiment is used in a multi-wafer type of thermal processing apparatus such as is shown in FIG. 10, and the thermal processing of a workpiece therein is as described below.

When the wafer support 118 holding the wafer 28 that is the workpiece is moved within the process tube 12 to the prescribed position, the elevator mechanism 110 is positioned in the outside atmosphere. In addition, in a similar way to that described above with reference to other embodiments, the wafer support 118 is isolated from the outer atmosphere by the freely expandable bellows-shaped tubular body 120 comprising the inner tube 122 and the outer tube 120a and is placed within the same atmosphere as that within the process tube 12, the gap 121 between the inner tube 122 and the outer tube 120a of the bellows-shaped tubular body 120 is filled with a gas, and, if the pressure within the process tube 12 is taken to be P1, the pressure P2 within the gap 121 is controlled during the thermal processing as follows:

While the semiconductor wafer is moving:

$P1 \leq P2 <$ outer atmosphere

During thermal processing of the semiconductor wafer:

$P1 > P2$

Specific values of P1 and P2 are determined by the type of thermal processing. Some specific examples of these pressures are given below with reference to different types of thermal processing.

Oxide Diffusion Processing

If the pressure P1 within the process tube 12 while the wafer 28 is being thermally processed is set to be within about, for example, $\pm 50$ mmH$_2$O of that of the outer atmosphere, the pressure P2 within the gap 121 during that time could be between about (P1−1.0) and (P1−20) mmH$_2$O.

If the pressure P1 within the process tube 12 while the wafer 28 is being raised or lowered is set to be within about, for example, $\pm 10$ mmH$_2$O of that of the outer atmosphere, the pressure P2 within the gap 121 during that time could be between about P1 and (P1+10) mmH$_2$O.

Reduced-Pressure Oxide Diffusion Processing

In order to exclude moisture from within the process tube 12 before the thermal processing, the pressure therein is reduced to $10^{-3}$ Torr, for example. Next, while the wafer 28 is being thermally processed, the pressure P1 within the process tube 12 is set to within about, for example, $\pm 50$ mmH$_2$O of that of the outer atmosphere. The pressure P2 within the gap 121 during that time could be between about (P1−1.0) and (P1−20) mmH$_2$O.

If the pressure P1 within the process tube 12 while the wafer 28 is being raised or lowered is set to be within about, for example, ±10 mmH$_2$O of that of the outer atmosphere, the pressure P2 within the gap 121 during that time could be between about P1 and (P1+10) mmH$_2$O.

Reduced-Pressure CVD Processing

The pressure within the process tube 12 before the thermal processing is reduced to 10$^{-3}$ Torr, for example. Next, while the wafer 28 is being thermally processed, the pressure P1 within the process tube 12 is set to about 1 to 10 Torr, for example. The pressure P2 within the gap 121 during the same time is set to about 10 to 20 Torr, for example.

If the pressure P1 within the process tube 12 while the wafer 28 is being raised or lowered is set to be within about, for example, 10$^{-2}$ to 10$^{-3}$ Torr, the pressure P2 within the gap 121 during that time could be 10$^{-1}$ to 10$^{-2}$ Torr.

The following effects are achieved by this embodiment:

Not only can the wafer 28 be subjected to thermal processing smoothly without any damage due to impurities from the wafer elevator mechanism 110, the relationship between the pressure P1 within the process tube 12 and the pressure P2 within the gap 121 in the double-walled bellows-shaped tubular body 120 while the wafer 28 is moving is as follows:

$$P1 \leq P2 < \text{outer atmosphere}$$

This ensures that, if a pinhole should occur in the inner tube 122 of the bellows-shaped tubular body 120, leakage of gas from within the process tube 12 can be prevented.

While the wafer 28 is being thermally processed, the pressures are controlled such that:

$$P1 > P2$$

to ensure that, if a pinhole should occur in the inner tube 122 of the bellows-shaped tubular body 120, there is no danger of gas within the gap 121 between the inner tube 122 and the outer tube 120a entering into the process tube 12, and thus adverse effects on the wafer 28 can be prevented.

EMBODIMENT 7

A seventh embodiment applied to the present invention will be described below with reference to figures.

It is known that, when a workpiece is subjected to thermal processing, the thermal processing efficiency generally varies with the direction of radiant heat with respect to the workpiece. In other words, when thermal processing on a film of an insulating material such as SiO$_2$ or Si$_3$N$_4$ is performed, radiating heat in the direction perpendicular to the workpiece increases the thermal absorbency ratio of the film, and thus increases the efficiency of the thermal processing. Conversely, when thermal processing on a film of a metal material such as aluminum or polysilicon is performed, radiating heat at an angle to the perpendicular, such as at 60°, increases the efficiency of the thermal processing.

Figure 21A:
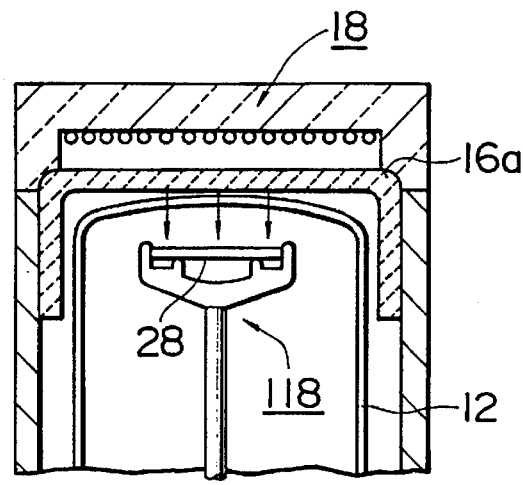
FIGS. 21A–21C are descriptive views of different heating positions of wafers when subjected to different thermal processes by the thermal processing apparatus of the present invention.
Figure 21B:
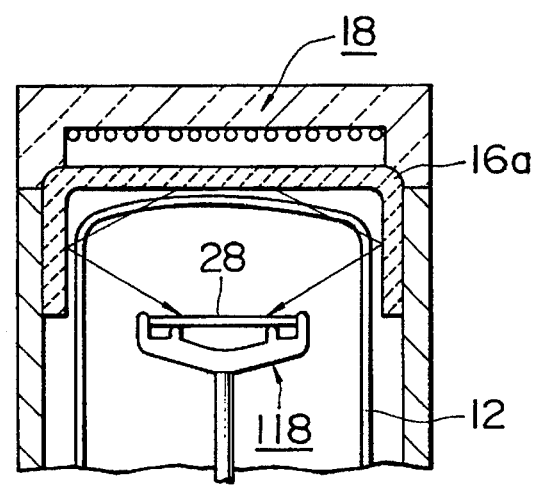
Figure 21C:
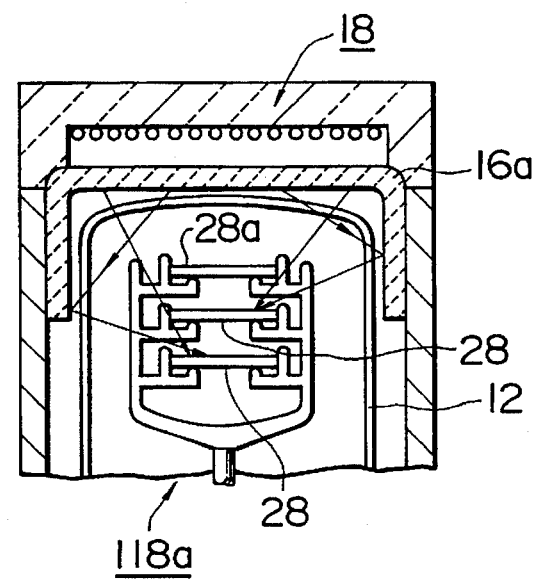

In accordance with this embodiment, the thermal processing efficiency can be optimized to correspond to each of these different types of thermal processing. Different modes of this embodiment are shown in FIGS. 21A to 21C. In other words, during the thermal processing of a film made of an insulating material, the wafer 28 mounted on the wafer support 118 is thermally processed at a processing position that is comparatively close to the upper wall of the process tube 12, as shown in FIG. 21A. If this is done, as shown in FIG. 21A, the radiant heat incident on the wafer 28 is such that the component thereof that is incident perpendicular to the wafer 28 is greater than the component thereof that is incident parallel thereto, thus ensuring that the thermal processing efficiency is greatly increased. In this case, the lower end of a thermal equalizer portion 16a is preferably of an extended form such that it is positioned at either the same height as the processing position of the wafer 28, or lower.

Conversely, during the thermal processing of a film of a metal material, for example, the wafer 28 is thermally processed at a processing position that is further from the upper wall of the process tube 12, as shown in FIG. 21B. If this is done, as shown in FIG. 21B, of the radiant heat incident on the wafer 28, the component thereof that is incident at, for example, 60° can be made to increase, thus ensuring that the thermal processing efficiency is greatly increased. Note that in this case too, the lower end of the thermal equalizer portion 16a is preferably of an extended form such that it is positioned at either the same height as the processing position of the wafer 28, or lower.

The thermal processing apparatus of Embodiment 7 is configured in a similar manner to that of the other embodiments, and comprises a thermal processing section 10, a wafer conveyor section 70, a first lid drive section 970, and a wafer elevator section 110.

Figure 12:
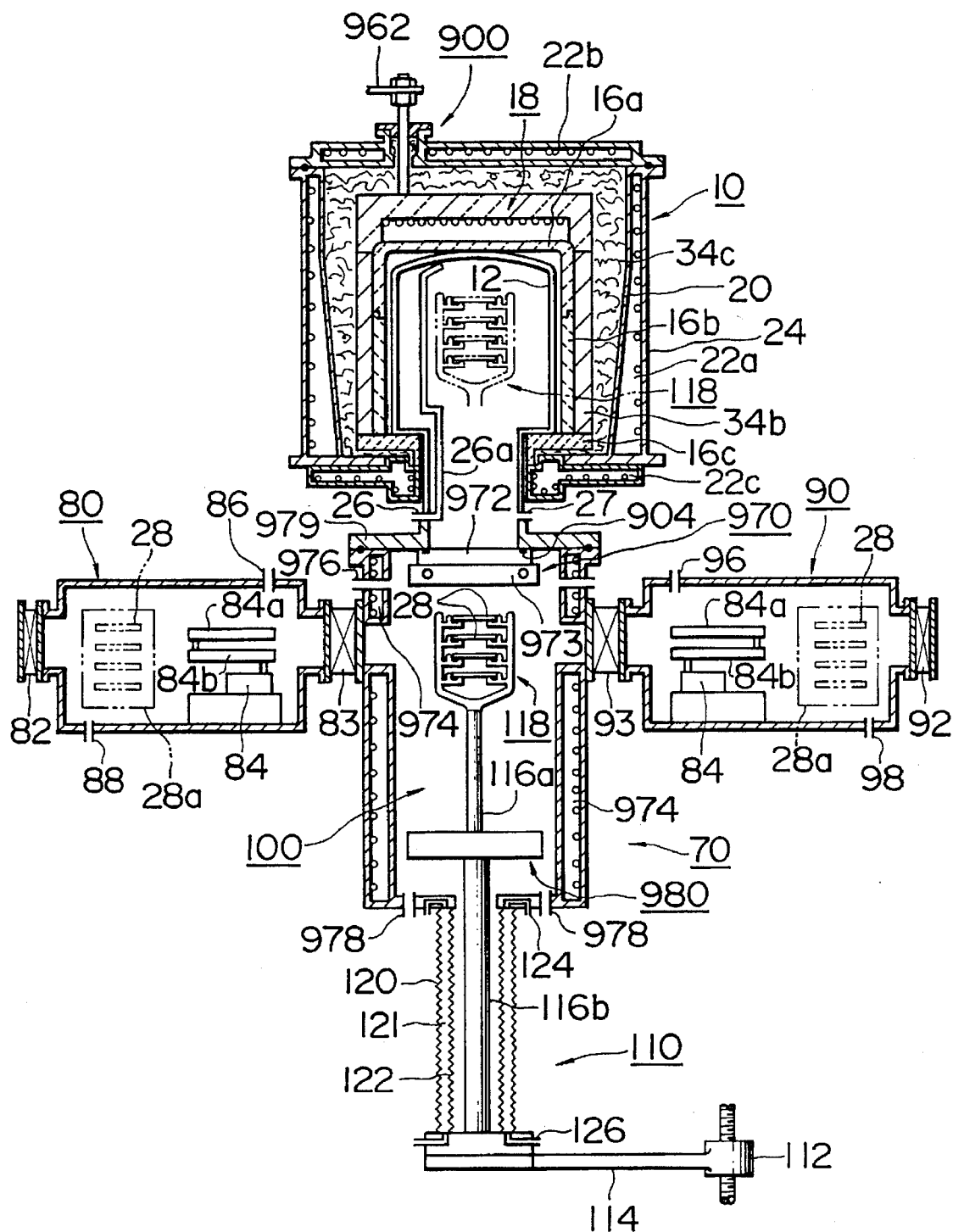
FIG. 12 is an abbreviated lateral cross-sectional view illustrating a seventh embodiment of the thermal processing apparatus according to the present invention.

Since the configuration of the thermal processing section 10 is similar to that of other embodiments, only the reference numbers of components are shown in FIG. 12 and detailed description thereof is omitted. Note that the gas introduction holes 26, the gas exhaust holes 27, and a nozzle 26a introduce gas into the process tube 12 and exhaust it therefrom to enable the thermal processing of the wafer 28.

The configuration of the wafer conveyor section 70 is similar to that of the other embodiments.

In this case, the conveyor arm 84 is configured of an arm having, for example, a multi-jointed structure, and it has the function of conveying wafers into and out of the load lock chamber 80 and the reception chamber 100 by a first arm 84a and a second arm 84b.

In the same way as in the other embodiments, the reception chamber 100 is intended to receive the wafer 28 and pass it on to the process tube 12, and a water cooling mechanism 974 is provided between the reception chamber 100 and the process tube 12 to provide thermal insulation from the outside. Note that the connecting section between the quartz process tube 12 and the reception chamber 100 is sealed in an airtight manner by a airtight sealing portion such as an O-ring 979. The area between the reception chamber 100 and the process tube 12 has an openable structure provided by the first lid drive section 970.

The configuration of the first lid drive section 970 will be described below with reference to the plan view of the apparatus shown in FIG. 13.

A first lid section 972 formed of a circular plate is provided on a base 973 and can be freely raised from and lowered onto the base 973 by an elevator mechanism (not shown). Thus the area between the process tube 12 and the reception chamber 100 can be opened and closed by raising and lowering the first lid section 972. Note that the first lid section 972 is provided with a sealing material 904 of an annular structure, in order to increase the degree of airtight sealing and the thermal insulation when the process tube 12 is sealed. This sealing material 904 is preferably made of a material that has a high heat resistance, such as yarn or felted rope.

Figure 13:
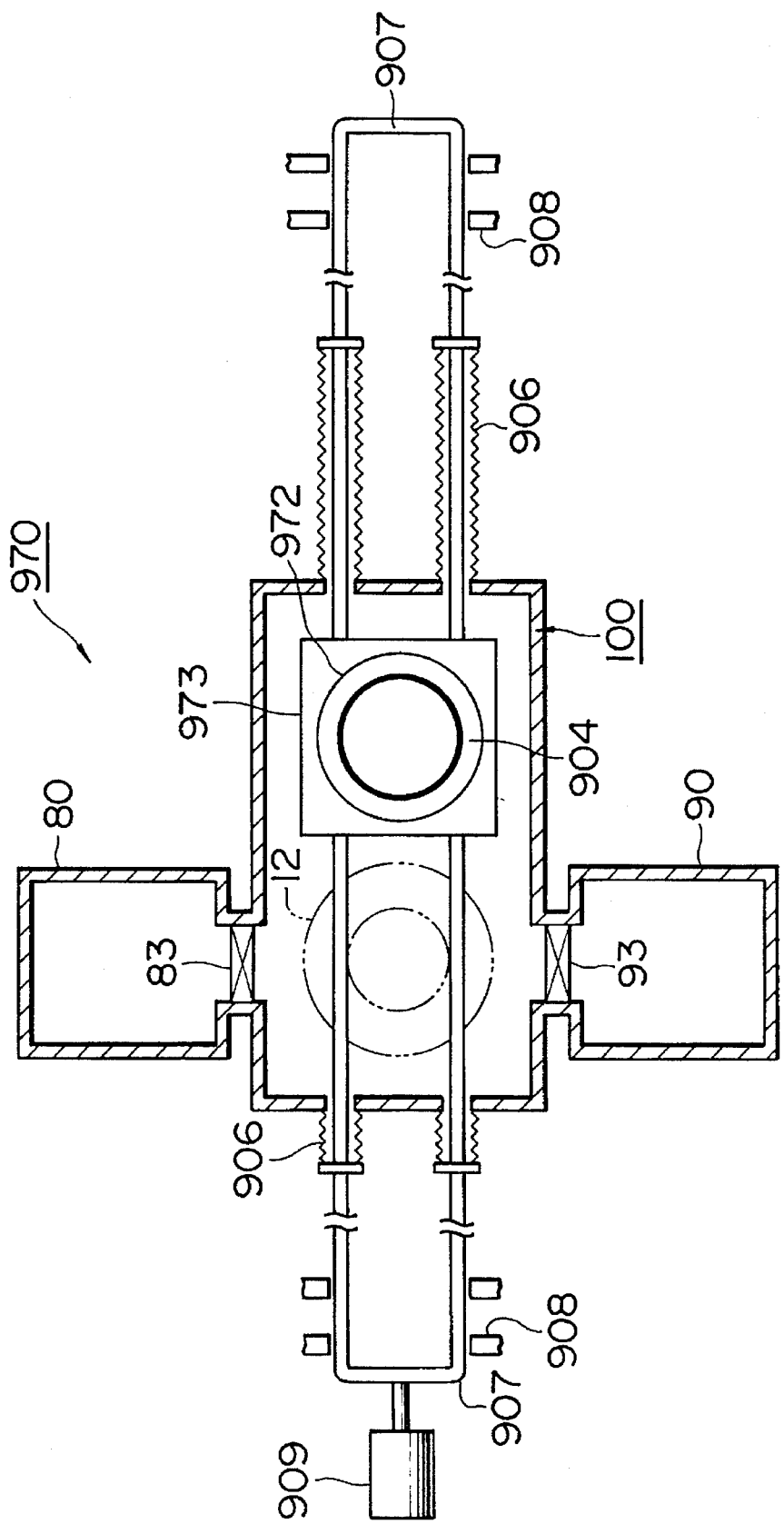
FIG. 13 is a partial breakaway plan view of a first lid drive section of the thermal processing apparatus of FIG. 12.

As also shown in FIG. 13, the base 973 is fixed to arms 907 and these arms 907 can be driven horizontally by a drive mechanism such as an air cylinder 909. Thus when the process tube 12 is sealed in an airtight manner, the first lid section 972 is moved to under the process tube 12 by the air cylinder 909, the first lid section 972 is raised by the above-mentioned elevator mechanism, and this seals the process tube 12. Next, when the process tube 12 is opened and the wafer 28 in conveyed thereinto, the first lid section 972 is lowered by the elevator mechanism, the first lid section 972 is moved out of the way by the air cylinder 909, and this allows the wafer 28 to me conveyed out.

Note that, in this case, to ensure that the arms 907 move horizontally, it is preferable to provide guides 908 beside the arms 907. In addition, in order to maintain the airtight seal between the outer atmosphere and the reception chamber 100, bellows 906 are provided connected to the arms 907.

The wafer elevator section 110 has a configuration similar to that of the other embodiments.

Figure 14:
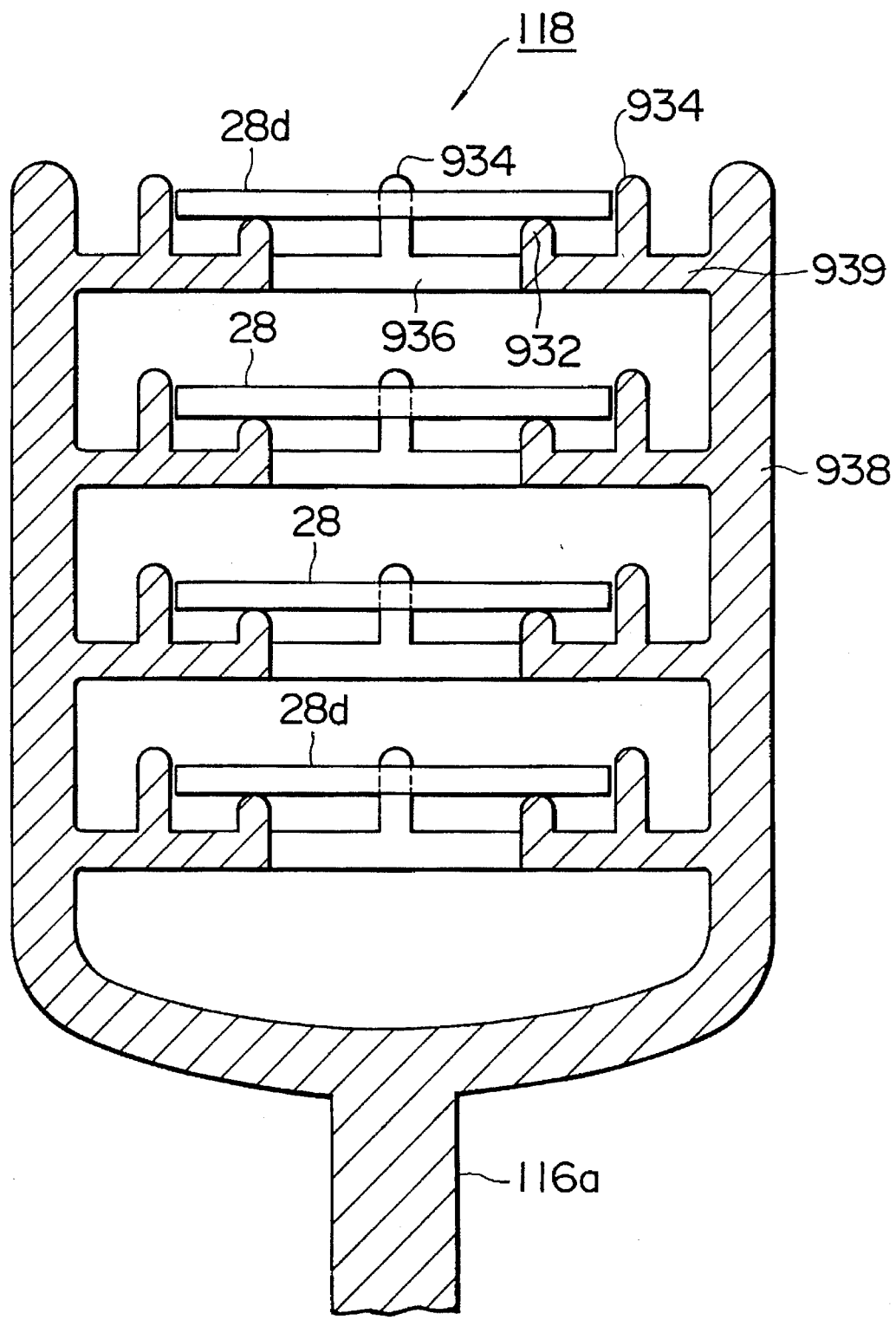
FIG. 14 is a partial expanded lateral cross-sectional view of a wafer support used in the thermal processing apparatus of FIG. 12.
Figure 15:
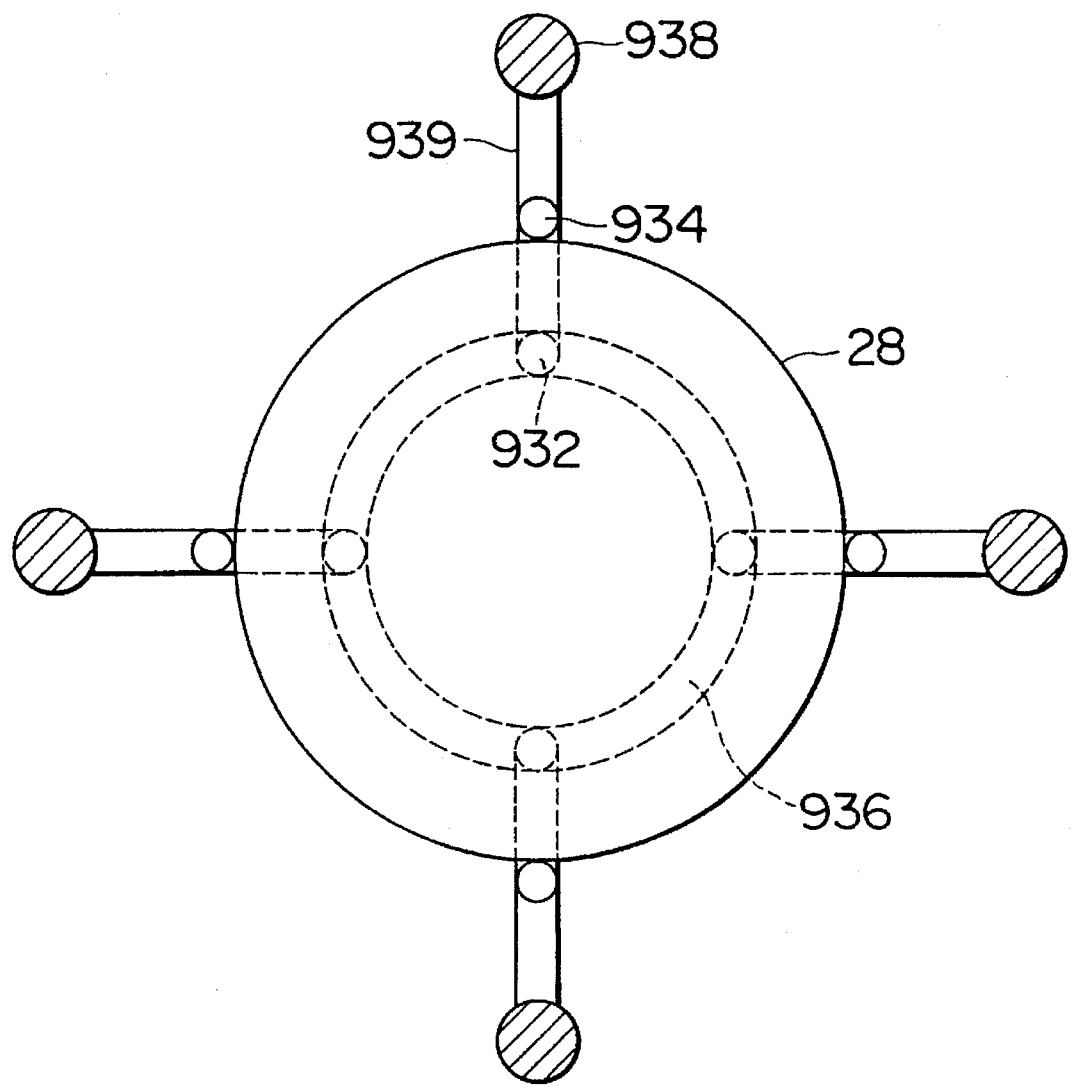
FIG. 15 is a partially cutaway plan view of the wafer support shown in FIG. 14, as seen from above.

A second lid section 980 made of a material such as quartz is connected to the top end of an elevator shaft 116b, and the wafer support 118 is supported on a support shaft 116a connected to the second lid section 980. The wafer support 118 is made of a material that has excellent heat resistance and is not liable to contaminate the interior, such as quartz or silicon carbide, and has a configuration such as that shown in FIGS. 14 and 15. FIG. 14 is a cross-section through the wafer support 118 and FIG. 15 is a plan view thereof. A plurality of rings 936 of the wafer support 118 are supported from all directions by support portions 939 formed so as to protrude from a plurality (such as four) of support columns 938. Each of the support portions 939 is formed integrally with a first protrusion 932 and a second protrusion 934. Protruding parts of the first protrusions 932 are designed to support the rear surface of the wafer support 118, in contact therewith. The second protrusions 934 are in contact with the edge surface of the wafer 28, to prevent any deviation in position of the wafer 28. Note that at least three of each of the first and second protrusions 932 and 934 are provided.

With the wafer support 118 constructed in the above manner, a plurality of wafers 28 can be held in a stacked manner, as shown in FIG. 14. Even though a plurality of wafers 28 can be held in this way, each of the wafers 28 can be exposed to a sufficient amount of a uniform flow of the process gas. In addition, since each wafer 28 is supported in point or minimal-area contact with the first protrusions 932, heat within the wafer 28 can be maintained uniform. Thus the above-described configuration of the wafer support enables a plurality of wafers 28 to receive uniform thermal processing.

Note that the configuration shown in FIG. 14 is such that two wafers 28 are held in the wafer support, with dummies 28d above and below them. Unprocessed dummy wafers or circular blanks of silicon carbide can be used as these dummies 28d. The uppermost dummy 28d can either reflect or absorb the radiant heat coming from a heater unit 18. If a dummy 28d is placed in the uppermost position in this way, the proportion of the component of the radiant heat incident on the wafers 28 that is incident at 60°, for example, can be increased, as shown in FIG. 21C. Therefore, the efficiency during thermal processing of a film such as a metal film such as aluminum or polysilicon and be greatly increased. In addition, the dummy 28d in the lowermost position can be used as a monitor wafer.

The second lid section 980 shown in FIG. 12 is configured as shown in FIG. 16. A lid material 948 made from highly pure quartz with a low level of contamination has a configuration such that is provided with an annular groove section 944 and engages with an annular projection formed around the lower edge of the process tube 12 when at its maximum elevation, to form a airtight seal. The annular groove section 944 is filled with a sealing material 946 such as felt or other cloth, to enable a gas seal between the process tube 12 and the reception chamber 100, and also increase the thermal insulation effect within the process tube 12.

Between the lid material 948 and a lower lid material section 952, which is provided around the lower edge thereof and is made of a material such as stainless steel, is packed a thermal insulation material 950 formed of quartz fiber, and a water cooling mechanism 951 formed of a water cooled jacket, for example, is provided within the lower lid material section 952. This configuration enables a further increase in the thermal insulation effect within the process tube 12.

Figure 17A:
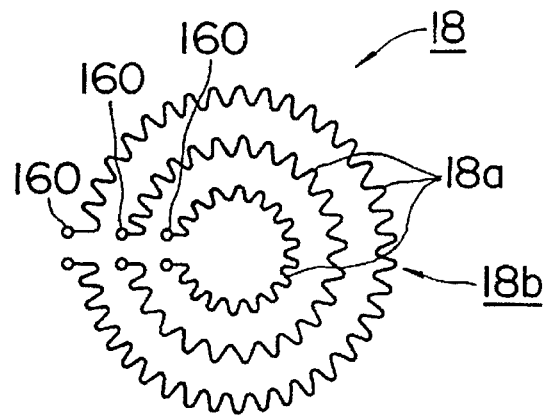
FIGS. 17A–17D are plan views of flat heat generation source shapes for use with the thermal processing apparatus of FIG. 12.
Figure 17B:
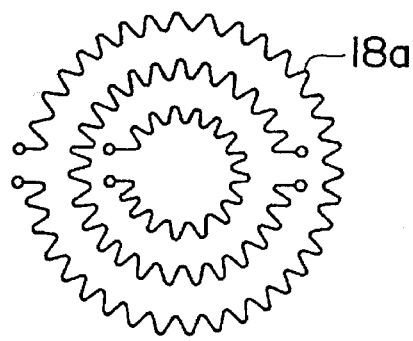
Figure 17C:
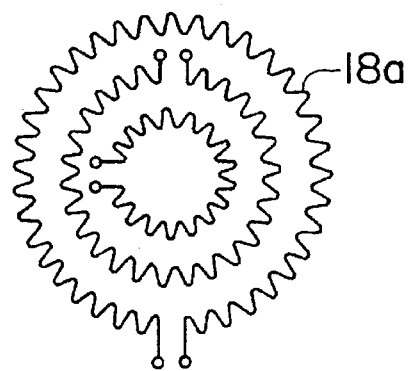
Figure 17D:
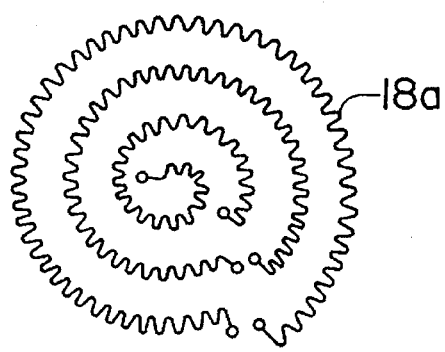
Figure 18:
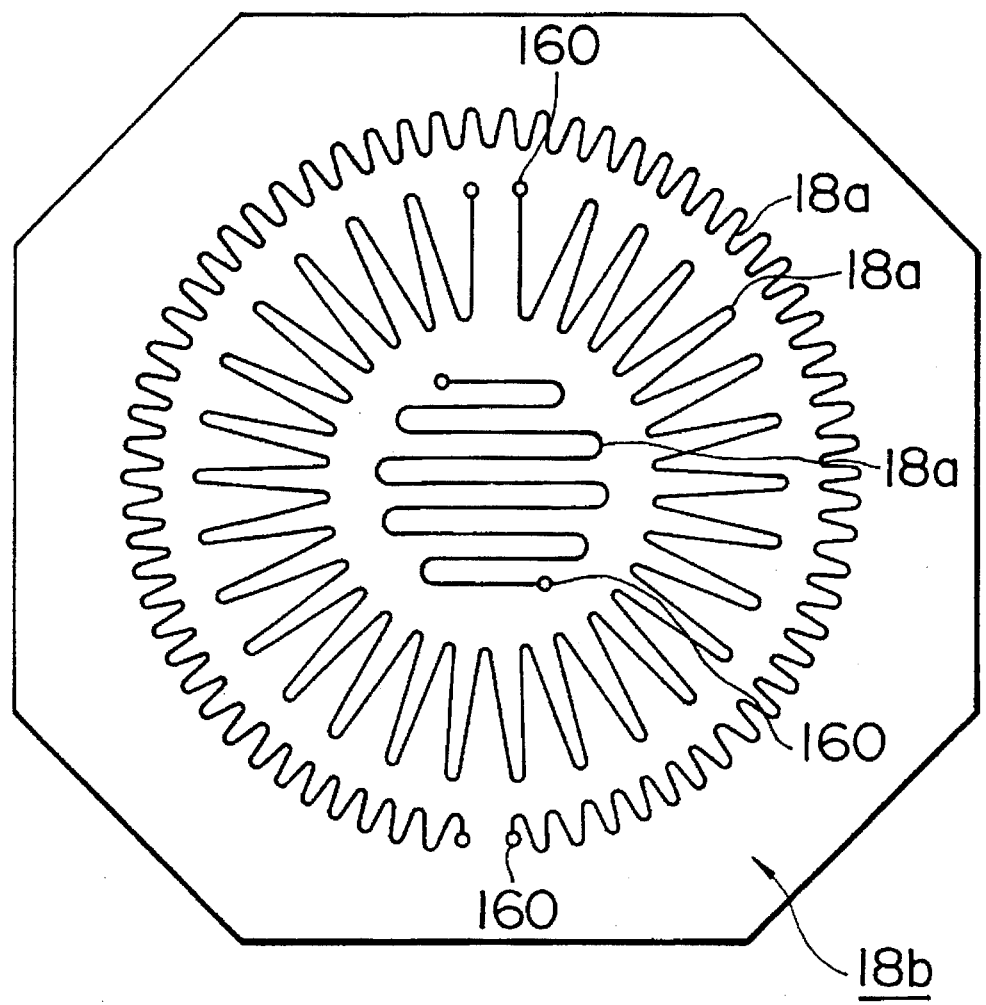
FIG. 18 is a plan view of yet another flat heat generation source shape for use with the thermal processing apparatus of FIG. 12.

FIGS. 17 and 18 show individual examples of flat heat generation sources 18b used in the heater unit 18.

Each of the heater units 18 shown in FIGS. 17A, 17B, and 17C is configured in three concentric zones, each consisting of a heater element 18a formed into, for example, a wavy shape. Dividing the area into three zones in this way enables control of the amount of heat generated by each zone. In other words, by making the amount of heat generated by the central zone smaller and that generated by the peripheral zone larger, the thermal processing applied to the wafer 28 can be made more uniform within the surface. In this case, each heater element 18a is provided with heater terminals 160 in order to supply power thereto, but the takeout positions of these heater terminals 160 differ in each of FIGS. 17A, 17B, and 17C. In FIGS. 17B and 17C, the takeout positions are mutually staggered to facilitate terminal takeout. Note that in FIG. 17D, the configuration is such that wavy-shaped heater elements 18a are divided into three spiral-shaped zones, this increases heat uniformity within the surface. In FIG. 18, by varying the amplitude and tightness of the wavy shape in each of the three zones, the surface density of the heater elements 18a is varied, and this has the effect of further increasing the uniformity of the thermal processing over the wafer 28.

Figure 19:
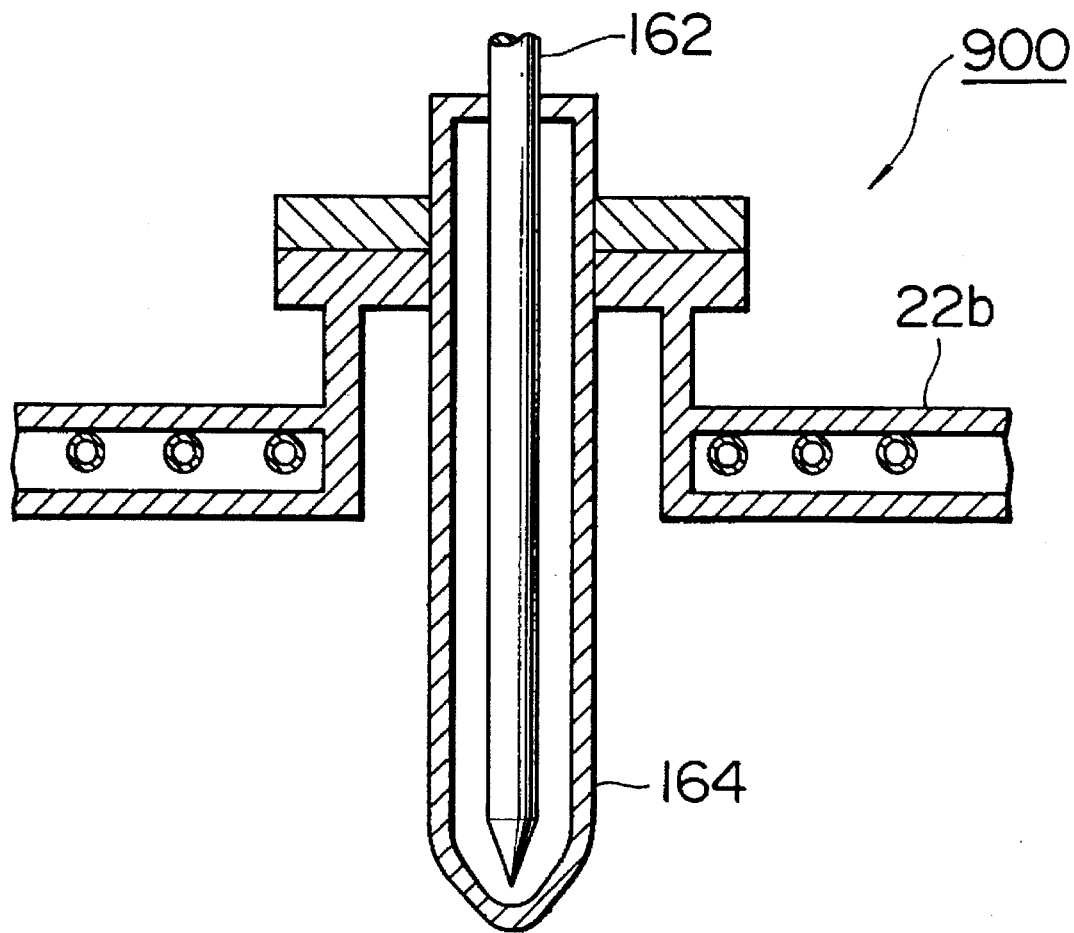
FIG. 19 is a partial expanded lateral cross-sectional view of the mounting structure of a thermocouple that detects electric power of the flat heat generation source for use with the thermal processing apparatus of FIG. 12.
Figure 20C:
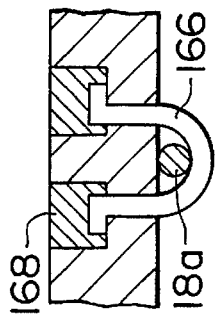
FIGS. 20A–20H are partial lateral cross-sectional views of heating element mounting structures for use with the thermal processing apparatus of FIG. 12.
Figure 20F:
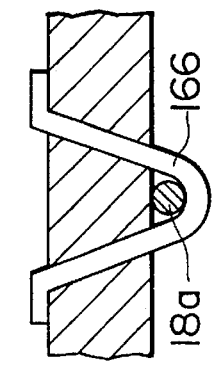
Figure 20I:
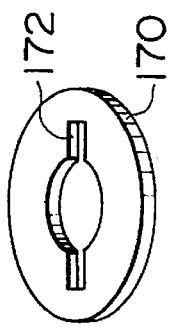
FIG. 20I is a perspective view of a washer for use with the heating element mounting structure of FIG. 20H.
Figure 20B:
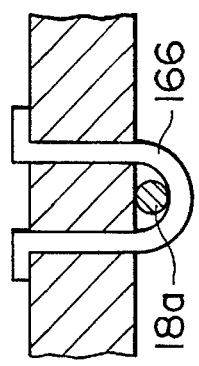
Figure 20E:
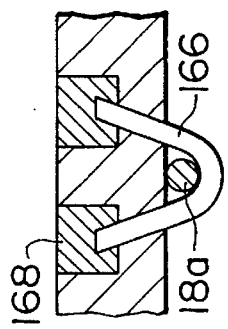
Figure 20H:
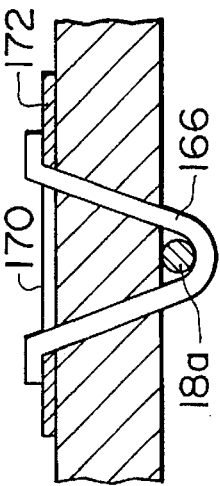
Figure 20A:
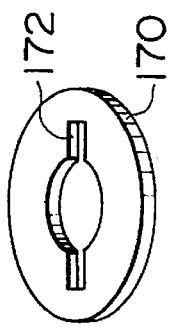
Figure 20D:
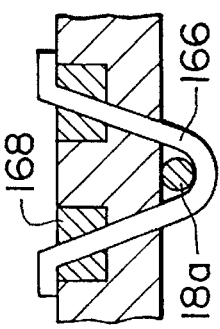
Figure 20G:
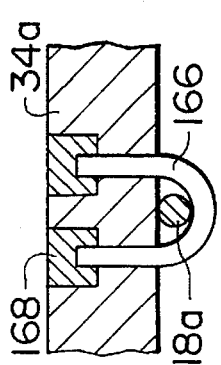

FIG. 19 shows an example of the configuration of a thermocouple 162 for detecting the temperature in each of the three zones that is provided in a terminal section 900. As shown in the figure, the configuration is preferably such that the thermocouple 162 is covered by a tube 164 made of a material such as alumina ($Al_2O_3$) ceramic.

FIG. 20 shows the configurations of various hooks 166 mounted in a thermal insulating material 34a. Each hook 166 is formed, for example, of the same material as the heater element 18a. In the hooks shown in FIGS. 20A to 20G, the heater element 18a is mounted on the thermal insulating material 34a by being suspended from hooks, 166 each of which is formed of a V- or U-shape and which is mounted in the thermal insulating material 34a. In FIGS. 20A, 20C, 20D, 20F, and 20G, a stopper material 168 is provided within the thermal insulating material 34a, and the hook 166 is held thereby. In FIG. 20H, the hook 166 is first inserted through a groove part 172 provided in a washer 170 (shown in FIG. 20I), then the washer 170 is rotated to mount the hook 166. This configuration ensures that the hook 166 and heater element 18a can be mounted and removed easily, so that the heater element 18a can be exchanged easily. Note that the diameter of the hook 166 is preferably made to be between, for example, one and three times that of the heater element 18a. Note also that after the heater elements 18a of FIGS. 20A to 20G are mounted on the thermal insulating material 34a, another piece of thermal insulating material 33 could be laid thereover.

Note that the embodiments of the present invention described herein should not be taken to limit the configuration of the invention in any way. For example, the shape of the thermal equalizer portion 16a used in the present invention is not limited to a U-shaped cross-section, so long as it has a shape provided with the first region and second region. Therefore, a thermal equalizer portion of a flat plate shape or a dome shape could be used.

What is claimed is:

1. A method of thermal processing wherein a process tube, having at one end an entrance/exit, is provided at the other end thereof with a heat generation source, and a workpiece to be processed is conveyed into the process tube through the entrance/exit to a prescribed position within the process tube, the method comprising the steps of, when said workpiece to be processed is being moved to said prescribed position, first moving said workpiece to a proximity position within the process tube closer to said heat generation source than said prescribed position, and returning said workpiece to said prescribed position.

2. A method of thermal processing wherein a process tube, having at one end thereof an entrance/exit, is provided at the other end thereof with a heat generation source, the method comprising the steps of:

conveying an object to be processed into the process tube through said entrance/exit;

moving said object to be processed to a prescribed position within said process tube;

measuring a processing temperature of said object to be processed to determine if said processing temperature of said workpiece to be processed varies from a prescribed processing temperature;

moving said workpiece to another position within the process tube in order to return said processing temperature of said object to be processed to said prescribed processing temperture when the processing temperature of said object to be processed at said prescribed position changes from a prescribed processing temperature while said workpiece to be processed is undergoing thermal processing;

performing a process on said object to be processed; and removing said object to be processed from said process tube.

3. A thermal processing apparatus comprising:

a process tube defining a wide processing space and a narrow elevator space;

a workpiece support means for holding a workpiece to be processed, said workpiece support means being provided with a tubular main column, at least three tubular support portions having closed end portions and passing through the interior of said main column and extending from said main column, and at least three positioning portions for positioning a workpiece, such that a rear surface of a workpiece to be processed is supported in contact with said closed end portions;

a main heat generation source positioned so as to face a processing surface of a workpiece to be processed, which workpiece has been positioned in said wide processing space by said workpiece support means;

a temperature detection means for detecting a temperature of a workpiece to be processed held in said workpiece support means, said temperature detection means being provided with a temperature sensor positioned in contact with an inner wall at said closed end portion of one of said tubular support portions, and a circuitry portion passing through said one of said tubular support portions and connected to an external control circuit; and a movement means for moving said workpiece support means toward and away from said main heat generation means while said workpiece support means is within said process tube, based on a detected temperature of a workpiece to be processed held in said workpiece support means.

4. The thermal processing apparatus according to claim 3, wherein said workpiece support means is provided with a main column, at least three support portions having end portions and extending from said column, and at least three positioning portions for positioning a workpiece, such that a rear surface of a workpiece is supported in contact with said end portions.

5. A method of thermal processing employing a process tube defining at one end thereof an entrance/exit and at another end thereof having a heat generation source, a workpiece to be processed being conveyed into the process tube through the entrance/exit to a prescribed position within said process tube, comprising:

moving said workpiece to a proximity position within said process tube, said proximity position being closer to said heat generation source than said prescribed position;

holding said workpiece at said proximity position;

moving said workpiece to said prescribed position; and holding said workpiece at said prescribed position.

6. A method of thermal processing in accordance with claim 5, wherein said workpiece is moved to said prescribed position from said proximity position when said workpiece has reached a predetermined temperature.

7. A method of thermal processing in accordance with claim 6, wherein said prescribed position is a position within said process tube where said workpiece is maintained at said predetermined temperature.

8. A method of thermal processing in accordance with claim 5, further including the step of measuring the temperature of said workpiece at said proximity position.

* * * * *